US009276185B2

(12) United States Patent
Nakamura et al.

(10) Patent No.: US 9,276,185 B2
(45) Date of Patent: Mar. 1, 2016

(54) LIGHT-EMITTING ELEMENT MOUNTING PACKAGE HAVING PROTRUDED WIRING AND RECESSED WIRING, AND LIGHT-EMITTING ELEMENT PACKAGE

(71) Applicant: SHINKO ELECTRIC INDUSTRIES CO., LTD., Nagano (JP)

(72) Inventors: Atsushi Nakamura, Nagano (JP);
Tsukasa Nakanishi, Nagano (JP);
Takayuki Matsumoto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/574,756

(22) Filed: Dec. 18, 2014

(65) Prior Publication Data

US 2015/0102380 A1   Apr. 16, 2015

Related U.S. Application Data

(63) Continuation of application No. 13/795,253, filed on Mar. 12, 2013, now Pat. No. 9,166,132.

(30) Foreign Application Priority Data

Mar. 23, 2012   (JP) .................................. 2012-068314
Nov. 21, 2012   (JP) .................................. 2012-255428

(51) Int. Cl.
*H01L 33/62*   (2010.01)
*H01L 33/64*   (2010.01)
*H01L 33/48*   (2010.01)
(Continued)

(52) U.S. Cl.
CPC .............. *H01L 33/64* (2013.01); *H01L 33/486* (2013.01); *H01L 33/62* (2013.01); *H01L 33/647* (2013.01); *H01L 2224/16* (2013.01); *H05K 1/0206* (2013.01); *H05K 1/113* (2013.01)

(58) Field of Classification Search
CPC ...... H01L 33/486; H01L 33/62; H01L 33/642
USPC .......................................................... 257/99
See application file for complete search history.

(56) References Cited

U.S. PATENT DOCUMENTS

2003/0072153 A1   4/2003   Matsui et al.
2003/0102160 A1   6/2003   Gaudiello et al.
(Continued)

FOREIGN PATENT DOCUMENTS

EP   2355140      8/2011
JP   S59-175755   10/1984
(Continued)

OTHER PUBLICATIONS

Extended European Search Report dated on Dec. 11, 2014 issued with respect to the corresponding European Patent Application No. 13159690.0.

*Primary Examiner* — Thomas L Dickey
(74) *Attorney, Agent, or Firm* — IPUSA, PLLC

(57) ABSTRACT

A light-emitting element mounting package including a first wiring forming a first light-emitting element mounting portion, which is provided on one surface of a substrate to mount a light-emitting element, and a first through wiring having one end and another end, the one end being electrically connected to the first light-emitting element mounting portion so as to be thermally transferable, and the other end protruding from another surface of the substrate.

8 Claims, 22 Drawing Sheets

(51) Int. Cl.
*H05K 1/02* (2006.01)
*H05K 1/11* (2006.01)

(56) References Cited

U.S. PATENT DOCUMENTS

2009/0001404 A1   1/2009  Ohata
2009/0273002 A1   11/2009  Chiou et al.
2009/0315057 A1*  12/2009  Konishi et al. .................. 257/98
2011/0114989 A1*  5/2011  Suehiro et al. .................. 257/99
2011/0241043 A1   10/2011  Nakayama
2011/0294240 A1*  12/2011  Kim ................................ 438/16
2012/0113328 A1   5/2012  Takeshima et al.
2013/0099276 A1*  4/2013  Fukushima et al. ............ 257/99

FOREIGN PATENT DOCUMENTS

| | | |
|---|---|---|
| JP | 2003-092011 | 3/2003 |
| JP | 2005-217216 | 8/2005 |
| JP | 2009-246066 | 10/2009 |
| JP | 2011-029634 | 2/2011 |
| JP | 2012-031401 | 2/2012 |
| WO | WO 2012002580 A1 * | 1/2012 |

* cited by examiner 53 51 52   45 43 44 41 42
  50          40         60

A

LIGHT-EMITTING ELEMENT MOUNTING PACKAGE HAVING PROTRUDED WIRING AND RECESSED WIRING, AND LIGHT-EMITTING ELEMENT PACKAGE

CROSS-REFERENCE TO RELATED APPLICATIONS

This application is a continuation application filed under 35 U.S.C. 111(a) claiming the benefit under 35 U.S.C. 120 of a U.S. patent application Ser. No. 13/795,253 filed on Mar. 12, 2013, which is based upon and claims the benefit of priority of the prior Japanese Patent Application No. 2012-068314, filed on Mar. 23, 2012, and Japanese Patent Application No. 2012-255428, filed on Nov. 21, 2012, the entire contents of which are incorporated herein by reference.

FIELD

The embodiments discussed herein are related to a light-emitting element mounting package on which a light-emitting element can be mounted, a manufacturing method of the same, and a light-emitting element package formed by mounting the light emitting element on the light-emitting element mounting package.

BACKGROUND

In recent years, there is proposed a light-emitting element package having a light emitting diode (hereinafter, referred to as a "LED") as a light-emitting element installed on the light-emitting element package. For example, the proposed light-emitting element package or the like is formed by plural groups of LEDs, each of which is made of three LEDs that are mounted on a wiring pattern on an upper surface of a flexible substrate, and plural radiator plates are provided by a bond so as to cover a portion corresponding to a mounting position of the plural groups of LEDs, as disclosed in Japanese Laid-open Patent Publication No. 2003-92011.

However, the above light-emitting element package is to radiate heat emitted by the groups of LEDs by providing the radiator plate at a portion corresponding to the position of mounting the groups of LEDs. Because a heat radiation route from the groups of LEDs to the radiation plate is insufficient, heat emitted by the groups of LEDs cannot be efficiently transferred to the radiator plate.

SUMMARY

According to an aspect of the embodiment, a light-emitting element mounting package includes a first wiring forming a first light-emitting element mounting portion, which is provided on one surface of a substrate to mount a light-emitting element; and a first through wiring having one end and another end, the one end being electrically connected to the first light-emitting element mounting portion so as to be thermally transferable, and the other end protruding from another surface of the substrate.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENTS

However, the light-emitting element package described previously is to radiate heat emitted by the groups of LEDs by providing the radiator plate at a portion corresponding to the position of mounting the groups of LEDs. Because a heat radiation route from the groups of LEDs to the radiation plate is insufficient, heat emitted by the groups of LEDs cannot be efficiently transferred to the radiator plate.

Preferred embodiments of the present invention will be explained with reference to accompanying drawings. Where the same reference symbols are attached to the same parts, repeated description of the parts is omitted.

[a] First Embodiment

Structure of Light-Emitting Element Mounting Package of First Embodiment

Figure 1:
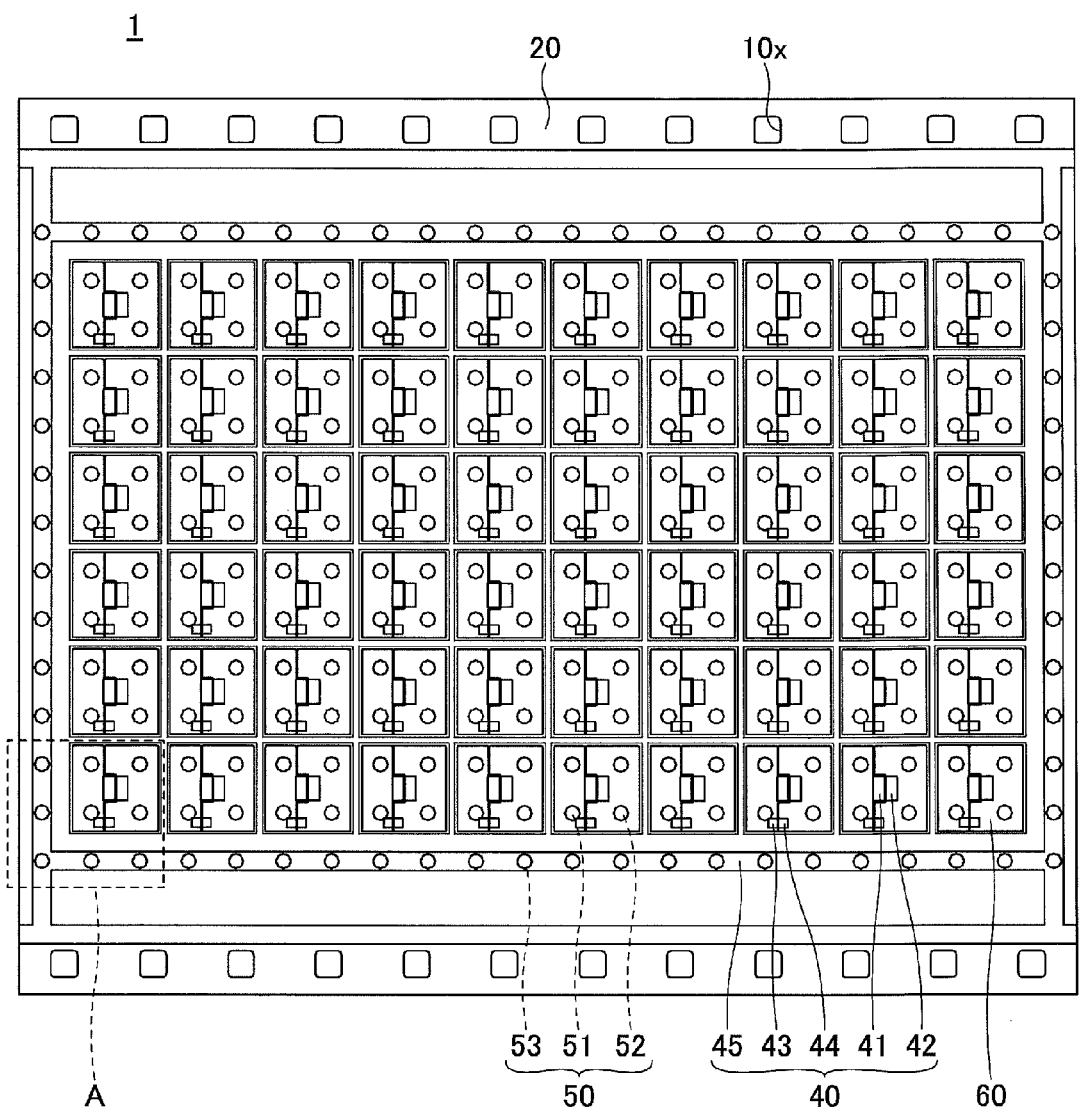
FIG. 1 is an exemplary plan view of a light-emitting element mounting package of a first embodiment.
Figure 2A:
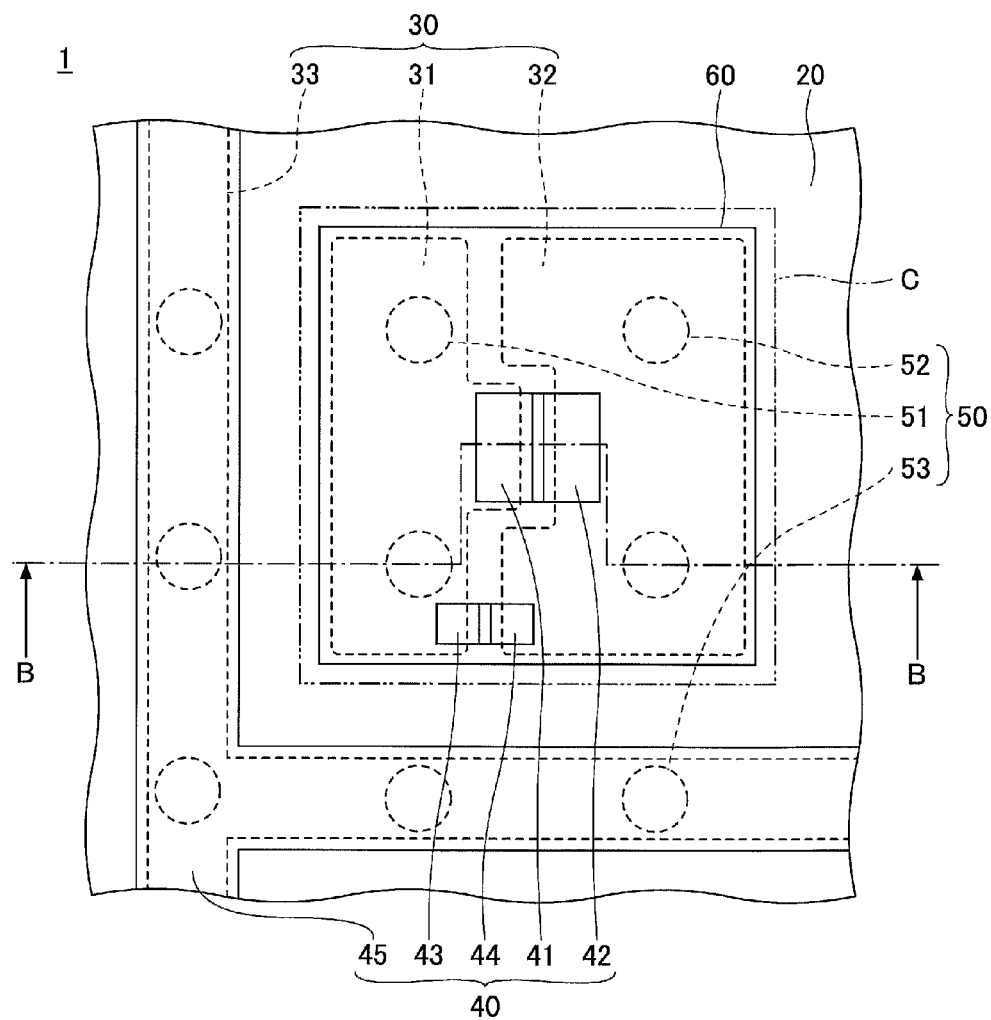
FIGS. 2A and 2B are exemplary enlarged views illustrating a part A of FIG. 1.
Figure 2B:
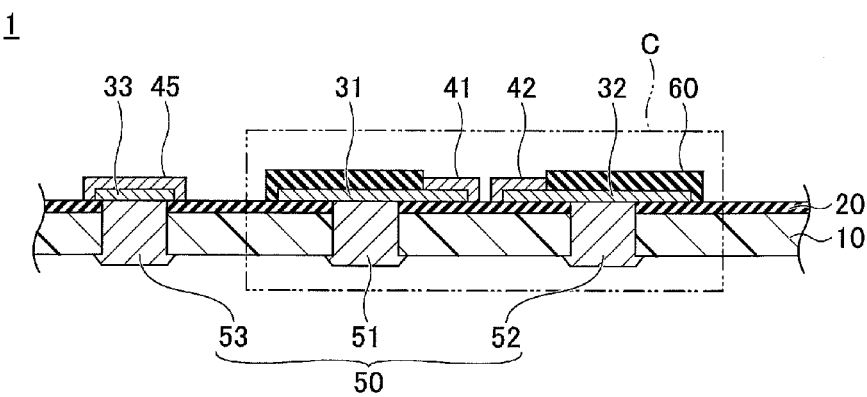

The structure of a light-emitting element mounting package of a first embodiment is described. FIG. 1 is an exemplary plan view of a light-emitting element mounting package of the first embodiment. FIG. 2A is an exemplary enlarged plan view of a portion A of FIG. 1. FIG. 2B is an exemplary cross-sectional view taken along a line B-B of FIG. 2A.

Referring to FIG. 1 and FIGS. 2A and 2B, the light-emitting element mounting package 1 includes a substrate 10, an adhesive layer 20, wirings 30 (including wirings 31 and 32 and a bus line 33), a plating film 40 (including plating films 41, 42, 43, 44, and 45), through wirings 50 (including through wirings 51, 52, and 53), and an insulating layer 60. Referring to FIG. 2, an area C surrounded by a two-dot chain line is finally cut along the two-dot chain line so as to be the area of the separate light-emitting element mounting packages (hereinafter, referred to as an individual package area C).

Said differently, the light-emitting element mounting package 1 includes plural individual package areas C, each of which are formed so as to mount one light-emitting element. Referring to FIG. 1, the light-emitting element mounting package 1 includes 60 individual package areas C. However, the number is not limited to this number.

In the light-emitting element mounting package 1, the substrate 10 is, for example, an insulating resin film having flexibility. The insulative resin film is, for example, a film (a polyimide tape) made of a polyimide resin, a film made of an epoxy resin, a film made of a polyester resin, or the like. However, the substrate 10 is not limited to an insulative resin film having flexibility. For example, a substrate 10 made of glass epoxy resin of Flame Retardant 4 (FR4) or the like may be used. For example, the thickness of the substrate 10 may be about 50 to 75 μm.

The adhesive layer 20 is bonded to one surface of the substrate 10 to fix the wirings 31 and 32 and the bus line 33 to the substrate 10. The adhesive layer 20 is, for example, a heat resistant adhesion bond made of an insulative resin such as an epoxy adhesion bond or a polyimide adhesion bond. The thickness of the adhesive layer 20 is, for example, about 8 μm to about 18 μm.

On both sides of the substrate 10, plural sprocket holes 10x are continually provided in a predetermined direction at substantially constant intervals. The sprocket holes 10x are through holes engaged with pins of sprockets, which are driven by a motor or the like, when the light-emitting element mounting package 1 is installed in an apparatus for mounting the light-emitting elements so that the light-emitting elements are mounted on the light-emitting element mounting package 1.

The width of the substrate 10 in a direction perpendicular to an arranging direction of the sprocket holes 10x may be determined so as to correspond to the apparatus on which the light-emitting element mounting package 1 is mounted. For example, the width of the substrate 10 may be about 40 mm to about 90 mm. On the other hand, the length (the arranging direction of the sprocket holes 10x) of the substrate 10 can be arbitrarily determined.

Referring to FIG. 1, the number of the individual package areas C is 10 rows. For example, if the insulative resin film having flexibility is used as the substrate 10, the substrate 10 may be further elongated so as to be about 100 rows where the light-emitting element mounting package 1 in a tape shape is shipped on a reel.

Between the sprocket holes 10x on one end portion of the substrate 10 and the sprocket holes 10x on the other end portion of the substrate 10, a bus line 33, of which surface is coated by a plating film 45, is arranged so as to surround all the individual package areas C, which bus lines 33 are longitudinally and laterally arranged. The bus line 33 is electrically connected to one end of the plural through wirings 53 penetrating the substrate 10 and the adhesive layer 20. The other ends of the through wirings 53 form protruding portions by protruding from the other surface of the substrate 10. The amount of the protrusions of the through wirings 53 from the other surface of the substrate 10 is, for example, about 20 μm to about 50 μm.

The bus line 33 is used to supply electric power for forming the plating film 40 on the wirings 31 and 32 by electroplating. However, the bus line 33 is not directly connected to the wirings 31 and 32. Said differently, inside the light-emitting element mounting package 1, the bus line 33 is electrically independent from the wirings 31 and 32 forming the light-emitting element mounting portion. A specific method of forming the plating film 40 on the wirings 30 using the bus line 33 is described later.

In the individual package areas C, the wirings 31 and 32 are provided on one surface of the substrate 10 via the adhesive layer 20. The wiring 31 is electrically connected to one end of the plural through wirings 51 penetrating the substrate 10 and the adhesive layer 20. The wirings 32 are electrically connected to the one ends of the plural through wirings 52 penetrating the substrate 10 and the adhesive layer 20.

The other ends of the through wirings 51 and 52 form protruding portions by protruding from the other surface of the substrate 10. The amount of the protrusions of the through wirings 51 and 52 from the other surface of the substrate 10 is, for example, about 20 μm to about 50 μm. The two through wirings 51 are connected to the wiring 31. The two through wirings 52 are connected to the wiring 32.

As described, from a view point of improving a heat radiation property, it is preferable to provide plural through wirings 51 and 52. However, the embodiment is not limited thereto. It is sufficient to provide at least one through wiring for each of the wirings 31 and 32. However, by providing two or more through wirings 51 and 52 for each of the wirings 31 and 32, it is preferable from a viewpoint of a balance in a case where the individual package areas C are diced and arranged on a predetermined plan portion. For example, in a case where the plan shape of the individual package area C is rectangular, the through wirings 51 and 52 (connection terminals) are provided on corners of the individual package areas C. As such, by providing the through wirings 51 and 52 at a time of mounting the light-emitting element mounting package or the light-emitting element package on the metallic substrate or the like, it is possible to prevent a package from being obliquely mounted.

For convenience, the through wirings 51, 52, and 53 are differently numbered. However, as described later, the through wirings 51, 52, and 53 may be formed by using the same material in the same process. Hereinafter, if it is not necessary to specifically distinguish the through wirings 51, 52, and 53, the through wirings 51, 52, and 53 are generally referred to as a through wiring 50. Further, the through wirings 51 and 52 may be referred to as a first through wiring, and the through wiring 53 may be referred to as a second through wiring. Further, protruding portions of the through wirings 51 and 52 may be referred to as a connection terminal. The material of the through wiring 50 is, for example, copper (Cu) or the like.

For example, the plan shape of the through wiring 50 may be a circle. In this case, the diameter is, for example, about 0.5 mm to 1 mm. However, the through wiring 50 contributes to an electric connection and also to heat radiation. Therefore, if the heat radiation property is to be improved, the diameter of the through wiring 50 may be 1 mm or greater. The plan shape of the through wiring 50 may be, for example, an ellipse, a rectangle, or the like.

The wirings 31 and 32 are covered by the insulating layer 60 provided substantially on an entire area of the individual package area C except for a part of the area C. The part of the area of the wirings 31 and 32 is exposed from the insulating layer 60. The plating films 41, 42, 43, and 44 are formed on the area of the wirings 31 and 32 exposed on the insulating layer 60.

It is preferable that the insulating layer 60 is provided to expose the surface of the adhesive layer 20 in a boundary division between adjacent individual package areas C. By providing the insulating layer 60, it is possible to prevent a crack or a drop of the periphery of the insulating layer 60 every time the light-emitting element mounting package 1 is cut into the individual package areas C. Therefore, the surface area of the insulating layer 60 can be prevented from being reduced to thereby prevent a drop of a reflectance ratio of the insulating layer 60. Further, when the light-emitting element mounting package 1 is cut into the individual package areas C in this case, the periphery of the insulating layer 60 is positioned inward from the periphery of the substrate 10.

When there is no crack in the insulating layer 60 or the like, the insulating layer 60 may be provided on the entire surface of the adhesive layer 20 including the boundary division between the individual package areas C. In this case, side surfaces of the insulating layer 60, the substrate 10, and the adhesive layer 20 may be substantially plane when the light-emitting element mounting package 1 is cut into the individual package areas C.

For convenience, the wirings 31, 32, and 33 are differently numbered. However, as described later, the wirings 31, 32, and 33 may be formed by using the same material in the same process. When it is unnecessary to specifically distinguish the wirings 31 and 32 and the bus line 33, the wirings 31 and 32 and the bus line 33 are generally referred to as a wiring 30. The material of the wiring 30 is, for example, copper (Cu) or the like. The thickness of the wiring 30 may be about 12 µm through about 35 µm.

Similarly, for convenience, the plating films 41, 42, 43, 44, and 45 are differently numbered. However, as described later, the plating films 41, 42, 43, 44, and 45 may be formed by using the same material in the same process. When it is unnecessary to specifically distinguish the plating films 41, 42, 43, 44, and 45, the plating films 41, 42, 43, 44, and 45 are generally referred to as a plating film 40.

For example, the plating films 40 are made of Ni or a Ni alloy/Au or a Au alloy film, Ni or a Ni alloy/Pd or a Pd alloy/Au or a Au alloy film, Ni or a Ni alloy/Pd or a Pd alloy/Ag or a Ag alloy/Au or a Au alloy film, Ag or a Ag alloy film, Ni or a Ni alloy/Ag or a Ag alloy film, Ni or a Ni alloy/Pd or a Pd alloy/Ag or a Ag alloy film, or the like. In this, the expression of "AA/BB" means a film of AA and a film of BB are laminated in this order on an object portion (similar when three or more films are formed).

It is preferable that the thicknesses of the Au or the Au alloy film and the Ag or the Ag alloy film in the plating film 40 are 0.1 µm or greater. It is preferable that the thickness of the Pd or the Pd alloy film in the plating film 40 is 0.005 µm or greater. It is preferable that the thickness of the Ni or the Ni alloy film in the plating film 40 is 0.5 µm or greater.

The insulating layer 60 is provided to increase a reflectance ratio and a heat radiation ratio of light irradiated by the light-emitting element installed in the individual package area C. The material forming the insulating layer 60 may be obtained by adding a filler or a pigment such as titanium oxide ($TiO_2$) or barium sulfate ($BaSO_4$) to, for example, an epoxy resin or a silicone resin such as organopolysiloxane. As the material of the insulating layer 60, a white ink made of the material may be used.

In a plan view, the wirings 31 and 32 form two areas facing each other while interposing a predetermined gap therebetween. The two areas form the light-emitting element mounting portion. Said differently, the light-emitting element mounting portion is formed by a metallic layer provided in a plan shape on substantially the entire surface of the substrate 10 in the individual package areas C. The metallic layer is divided into the two areas (the wirings 31 and 32) facing each other by a predetermined gap (a slit) provided in the metallic layer. Meanwhile, the predetermined gap (the slit) has the width corresponding to the gap between one of the electrodes and the other one of the electrodes of the light-emitting element.

The periphery of the light-emitting element mounting portion is provided inward from the periphery of the substrate 10 to the inside of the substrate 10. This is to prevent the side surfaces of the light-emitting element mounting portion (the wirings 31 and 32) from being exposed when the light-emitting element mounting package 1 is cut into the individual package areas C. Thus, it is possible to prevent a short circuit from occurring when the light-emitting element mounting package 1 is used.

The light-emitting element is mounted on the light-emitting element mounting portion. One of the plating films 41 and 42 formed on a part of an area of the light-emitting element mounting portion is connected to one electrode of the light-emitting element and the other one electrode of the light-emitting element is connected to the other electrode. Said differently, a portion of the wiring 31 where the plating film 41 is formed and a portion of the wiring 32 where the plating film 42 is formed face each other while interposing a predetermined gap therebetween. The plating films 41 and 42 are a connecting portion of one and the other one of the electrodes of the light-emitting element, respectively. The through wiring 51 being the light-emitting element mounting portion is connected immediately below the wiring 31. The through wiring 52 being the light-emitting element mounting portion is connected immediately below the wiring 32. With this, heat generated by the light-emitting element can be effectively radiated via the through wirings 51 and 52.

Further, a part of the wiring 31 where the plating film 43 is formed and a part of the wiring 32 where the plating film 44 is formed face each other while interposing the predetermined interval thereby enabling a protecting part being mounted on the plating films 43 and 44. One of the plating films 43 and 44 is connected to one of the electrodes of the protecting part. The other one of the plating films 43 and 44 is connected to the other one of the electrodes of the protecting part. Said differently, the plating films 43 and 44 are connecting portions of the one and the other electrode of the protecting part, respectively. However, the protecting part may not always be mounted and can be mounted depending on a need.

The protecting part is, for example, a Zener diode. In mounting the Zener diode, one of the plating films 43 and 44, which has a higher electric potential (i.e., the positive electrode of the light-emitting element), is a cathode. Meanwhile, the other of the plating films 43 and 44, which has a lower electric potential (i.e., the negative electrode of the light-emitting element), is an anode. By mounting the Zener diode between the plating film 43 and the plating film 44, it is possible to prevent the voltage between the plating films 43 and 44 from being a predetermined voltage (the Zener voltage) or greater.

The wirings 31 and 32 face each other so that a protrusion of the wiring 31 faces a recess of the wiring 32 while interposing a predetermined interval between the wirings 31 and 32 and the protrusion enters the recess in a plan view. The protrusion of the wiring 31 is a connecting portion for one of the electrodes of the light-emitting element. The recess of the wiring 32 is a connecting portion for the other one of the electrodes of the light-emitting element. Portions of the wirings 31 and 32 facing each other (other than the protrusion of the wiring 31 and the recess of the wiring 32) become connecting portions to be connected with the electrodes of the protecting part. Referring to FIG. 2A, the protrusion of the wiring 31 and the recess of the wiring 32 are provided in substantially the center of the facing portions of the wirings 31 and 32 while interposing a predetermined interval. However, the arrangement is not limited to the above arrangement.

The shapes of the wirings 31 and 32 are determined so as to separate a portion in which the protecting part is mounted from the portion in which the light-emitting element is mounted as far as possible. By mounting the protecting part in the vicinity of the light-emitting element, a part of the light is shielded by the protecting part to thereby possibly decrease illumination intensity. By arranging as illustrated in FIG. 2A, the protecting part is mounted as far as possible from the light-emitting element to thereby prevent the protecting part from being mounted right beside the light-emitting element. Thus, it is possible to prevent the illumination intensity from being reduced. However, the shape is not limited to the above shape.

Figure 3:
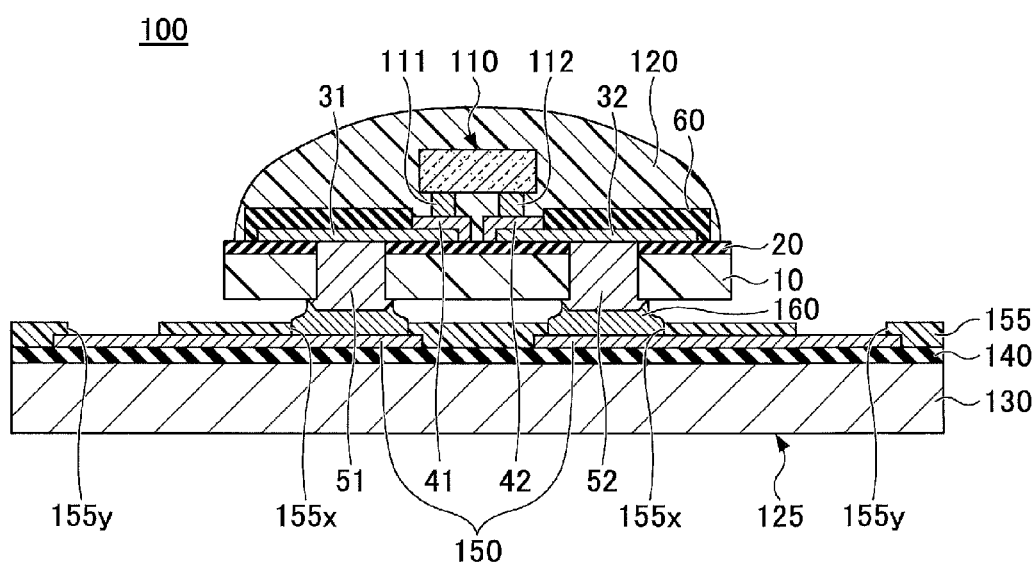
FIG. 3 is an exemplary cross-sectional view of a light-emitting element package of the first embodiment.

FIG. 3 is a cross-sectional view of a light-emitting element package 100 of the first embodiment. Referring to FIG. 3, a light-emitting element 110 is mounted on the light-emitting element mounting portion (the wirings 31 and 32) of the light-emitting element mounting package 1 after dicing (a portion of the individual package area C). Then, the light-emitting element 110 is sealed by a sealing resin 120 and further mounted on a metallic substrate 125.

The light-emitting element 110 may be a LED, on opposite side of which an anodic electrode and a cathodic electrode are formed. However, the light-emitting element 110 is not limited to a LED. For example, a surface emitting laser or the like may be used. The sealing resin 120 may be an epoxy or silicone insulative resin or the like containing a fluorescent material.

Hereinafter, an example in which the light-emitting element 110 is a LED and the light-emitting element package 100 is a LED package is exemplified. (The light-emitting element 110 may be referred to as a LED 110, and the light-emitting element package 100 may be referred to as a LED package 100.)

The dimensions of the LED 110 mounted on the light-emitting element mounting package 1 in its plan view is, for example, 0.3 mm in length×0.3 mm in width, 1.0 mm in length×1.0 mm in width, 1.5 mm in length×1.5 mm in width, or the like.

The LED 110 has a bump 111 being the one electrode and a bump 112 being the other electrode. One of the bumps 111 and 12 of the LED 110 is an anode terminal and the other one of the bumps 111 and 112 of the LED 110 is a cathode terminal. The bumps 111 and 112 are provided on the plating films 41 and 42 by flip-chip bonding. The interval between the plating films 41 and 42 is determined so as to correspond to an interval (for example, 60 μm) between the bumps 111 and 112 of the LED 110.

In the LED package 100, the light-emitting element mounting package 1 on which the LED 110 is mounted is further mounted on a metallic substrate 125. The metallic substrate 125 includes a metallic plate 130 functioning as a radiator portion (a radiator plate), an insulating layer 140 formed on one surface of the metallic plate 130, a wiring layer 150 formed on the insulating layer 140, and a solder resist layer 155 selectively coating the wiring layer 150.

Openings 155x and 155y are provided in the solder resist layer 155. Parts of the wirings 150 are exposed from the opening portions 155x and 155y. Hereinafter, the wirings 150 exposed on the opening portion 155x and the wiring 150 exposed on the opening portion 155y are referred to as outer connection pads 150A and 150B, respectively.

The material of the metallic plate 130 may be, for example, copper (Cu), aluminum (Al), or the like that has good heat conductivity. The thickness of the metallic plate 130 may be, for example, about 100 μm to about 500 μm. However, especially in a case where heat radiation property is required, the thickness of the metallic plate may be about several mm. The material of the insulating layer 140 may be, for example, an epoxy insulative resin, a silicone insulative resin, or the like. The material of the wiring layer 150 is, for example, copper (Cu) or the like.

One of the pads 150A is electrically connected to the protruding portion (a connection terminal) protruding from the other surface of the substrate 10 of the through wiring 51 via a joining portion 160 made of solder or conductive paste. Said differently, one of the pads 150A is electrically connected to the bump 111 being one of the electrode terminals of the LED 110 via the through wiring 51, the wiring 31, and the plating film 41.

The other one of the pads 150A is electrically connected to the protruding portion (a connection terminal) protruding from the other surface of the substrate 10 of the through wiring 52 via a joining portion 160 made of solder or conductive paste. Said differently, the other one of the pads 150A is electrically connected to the bump 112 being one of the electrode terminals of the LED 110 via the through wiring 52, the wiring 32, and the plating film 42.

The LED 110 emits light by connecting the outer connection pad 150B to a power source, a driving circuit, or the like, which is arranged outside the light-emitting element package 100, and by applying a predetermined potential difference between the bumps 111 and 112 of the LED 110. The LED 110 generates heat.

The heat generated by the LED 110 is transmitted to the through wiring 51 via the plating film 41 and the wiring 31, and further transmitted to the metallic plate 130 via one of the pads 150A and the insulating layer 140. Similarly, the heat generated by the LED 110 is transmitted to the through wiring 52 via the plating film 42 and the wiring 32, and further transmitted to the metallic plate 130 via the other one of the pads 150A and the insulating layer 140. The heat transferred to the metallic plate 130 is radiated by the metallic plate 130.

As described, the through wirings 51 and 52 form an electrical connecting route between the LED 110 mounted on the light-emitting element mounting portion and the metallic substrate 125 mainly contributing to heat radiation also forms a heat radiation route for transferring heat generated by the LED 110 to the metallic plate 130 of the metallic substrate 125.

Because the through wirings 51 and 52 are arranged in the vicinity of the LED 110 (for example, substantially below the LED 110), heat generated by the LED 110 can be efficiently transferred to the metallic plate 130 so that heat is radiated from the metallic plate 130.

Method of Manufacturing Light-Emitting Element Mounting Package of First Embodiment Next, the method of manufacturing the light-emitting element mounting package of the first embodiment is described. FIGS. 4A to 6D illustrate manufacturing processes of a light emitting element mounting package 1 of the first embodiment. The cross-sectional views used in explaining the manufacturing process of the light-emitting element mounting package of the first embodiment correspond to FIG. 2B.

Figure 4A:
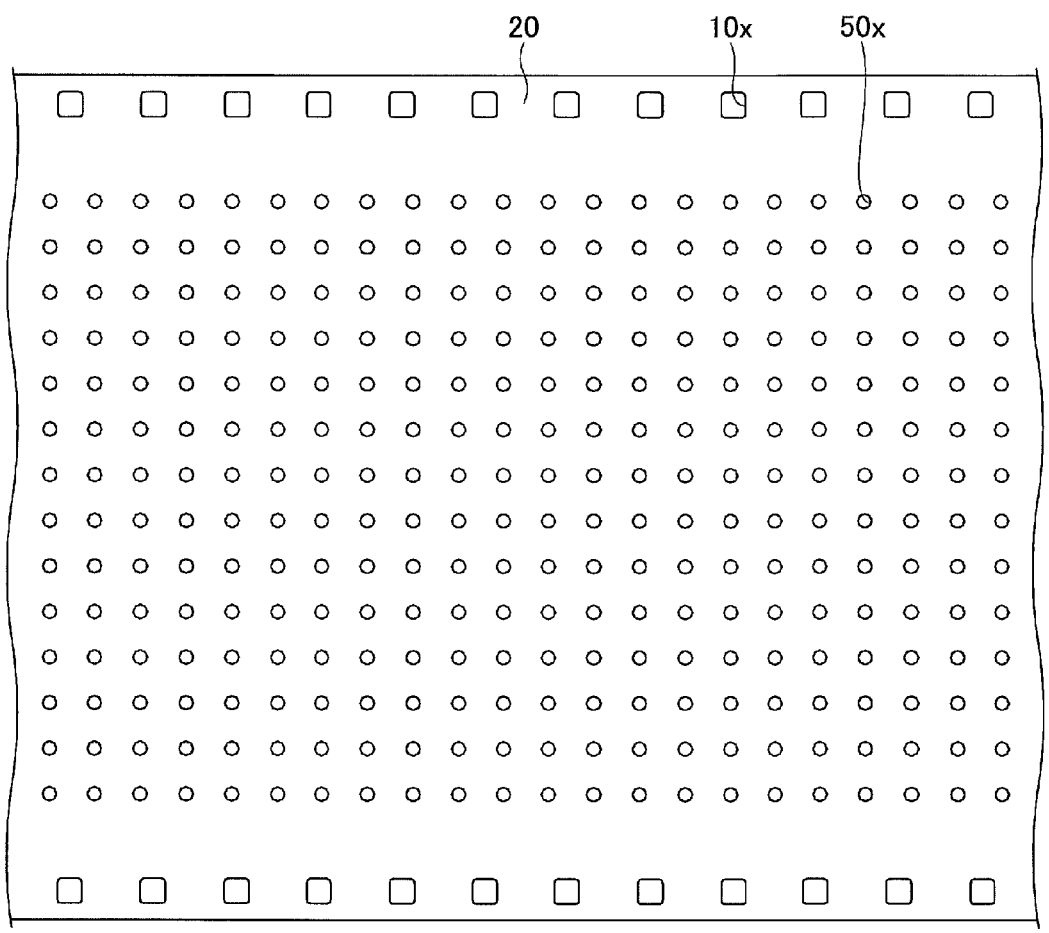
FIGS. 4A and 4B illustrate an exemplary manufacturing process of the light-emitting element mounting package of the first embodiment.
Figure 4B:
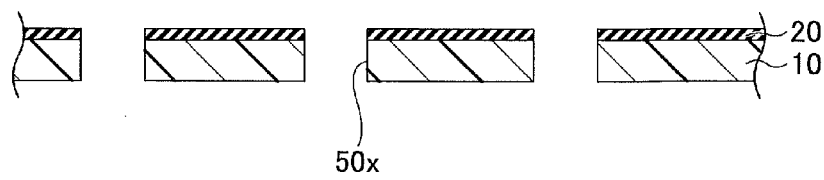

Within the process illustrated in FIG. 4 (FIG. 4A is a plan view, and FIG. 4B is a cross-sectional view corresponding to FIG. 2B), a polyimide film or the like in a reel-shape (a tape shape) is prepared as a substrate 10 and an adhesive layer 20 is formed by coating an epoxy adhesive bond or the like on one surface of the substrate 10. Instead of an epoxy adhesion bond, an epoxy adhesive film may be attached by adhering to the substrate 10.

Sprocket holes 10x and through holes 50x penetrating the substrate 10 and the adhesive layer 20 are formed on the substrate 10, which has the adhesive layer 20 formed on one surface of the substrate 10. The sprocket holes 10x are continuously formed on the lateral edges (the up and down directions in FIG. 4A) along a longitudinal direction (the left and right directions in FIG. 4A) of the substrate 10 while interposing substantially a constant interval. The through holes 50x are formed at predetermined positions (positions corresponding to the through wiring 50 illustrated in FIG. 1) where the wirings 30 are formed in the process described below. The sprocket holes 10x and the through holes 50x are formed by, for example, a punching process.

Figure 5A:
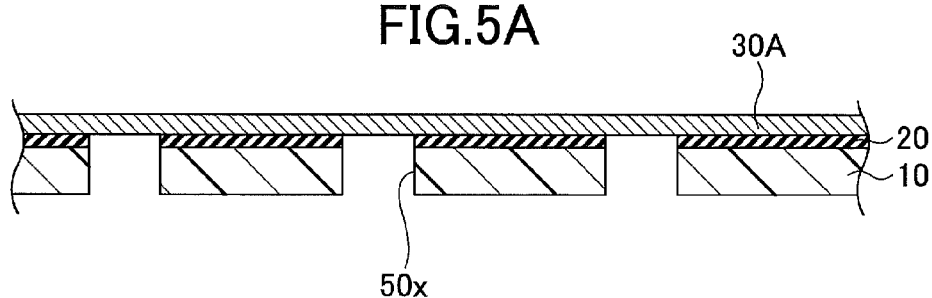
FIGS. 5A to 5D illustrate the exemplary manufacturing process of the light-emitting element mounting package of the first embodiment.

Next, in the process illustrated in FIG. 5A, the metallic layer 30A is formed on the adhesive layer 20. The adhesive layer 20 is hardened by heating at a predetermined temperature. For example, the metallic layer 30A can be formed by laminating a copper foil on the adhesive layer 20. The thickness of the metallic layer 30A may be about 18 µm to about 35 µm. The metallic layer 30A becomes the wiring 30 by being patterned later.

Figure 5B:
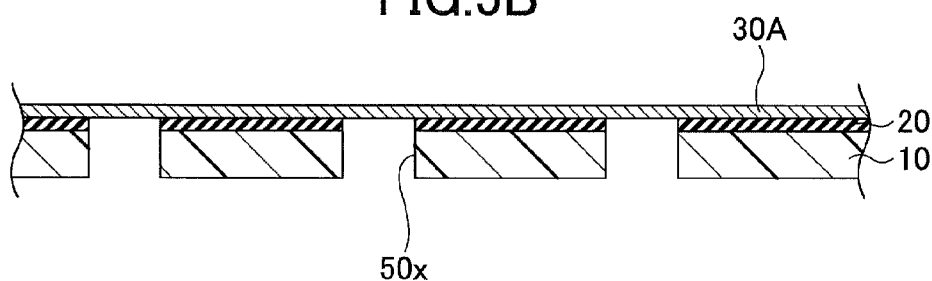

Next, in the process illustrated in FIG. 5B, by immersing a structure illustrated in FIG. 5A into a solution (e.g., a hydrogen peroxide solution) for wet-etching, a lower surface of the metallic layer 30A exposed in the through holes 50x and an upper surface of the metallic layer 30A are etched (so-called micro-etching). By this etching process, an antirust agent existing on the surface of the metallic layer 30A is removed and a slight thickness of the surface of the metallic layer 30A may be removed by, for example, about 0.5 µm to about 1 µm. The etching process may be performed when it is preferable to do so.

Figure 5C:
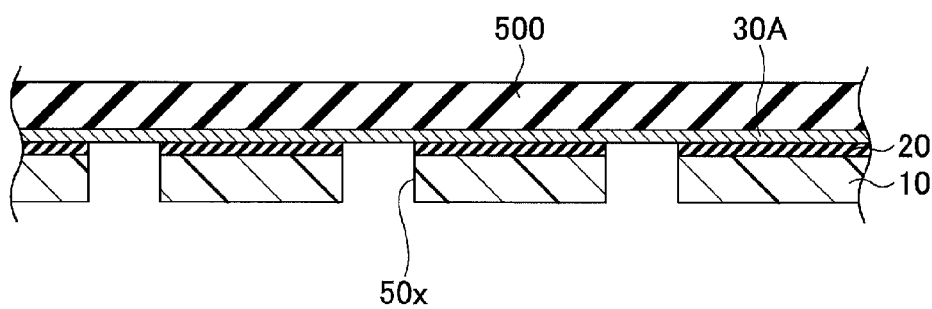

Referring to FIG. 5C, a masking tape 500 is attached to an upper surface of the metallic layer 30A. The masking tape 500 is to cover the upper surface of the metallic layer 30A so that the plating film does not grow on the upper surface of the metallic layer 30A at a time of forming the through wiring 50 by electroplating in the process illustrated in the following FIG. 5D.

Figure 5D:
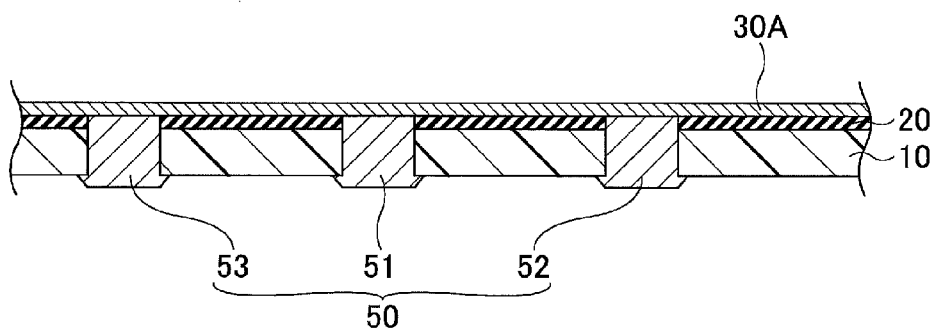

Referring to FIG. 5D, through wirings 50 (through wirings 51, 52, and 53) are formed by electroplating using the metallic layer 30A as a power supply layer. Thereafter, the masking tape 500 illustrated in FIG. 5C is removed. The through wiring 50 causes a plated metal to be precipitated on the lower surface of the metallic layer 30A inside the through hole 50x. Then, the plated metal fills the inside of the through hole 50x so as to be formed like a column.

The through wiring 50 is electrically connected to the metallic layer 30A on one end (the upper end of FIG. 5D). The through wiring 50 is formed so as to protrude from the other surface of the substrate 10 on the other end of the substrate (the lower end of FIG. 5D). The amount of the protrusions of the through wirings 50 from the other surface of the substrate 10 is, for example, about 20 µm to about 50 µm. The material of the through wiring 50 is, for example, copper (Cu) or the like.

Figure 6A:
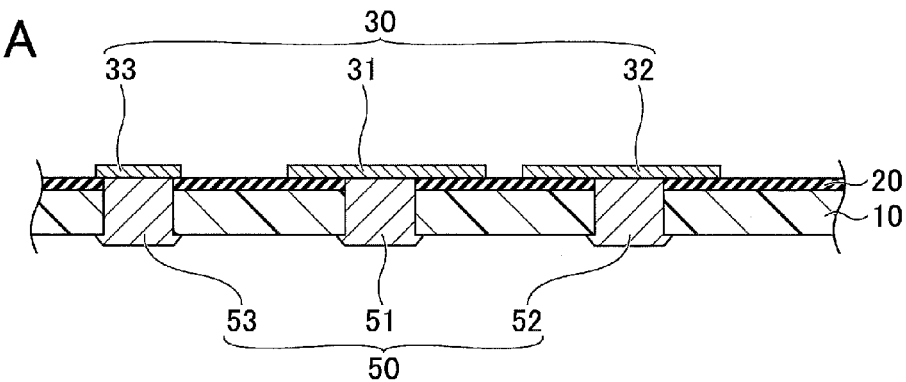
FIGS. 6A to 6D illustrate the exemplary manufacturing process of the light-emitting element mounting package of the first embodiment.

Next, referring to FIG. 6A, the metallic layer 30A is patterned to form the wirings 30 including the wirings 31 and 32 (the light-emitting element mounting portion) and the bus line 33. Specifically, for example, a resist (not illustrated) is coated on the metallic layer 30A. The metallic layer 30A is exposed to light to match the shape of the wiring 30. Then, the shape of the wiring 30 is developed. Then, the wiring 30 is formed by patterning by etching using the resist. After this, the resist is removed.

Figure 6B:
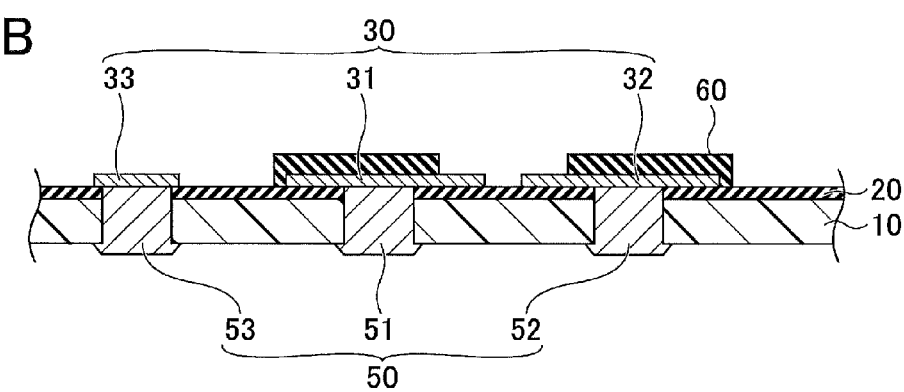

Referring to FIG. 6B, an insulating layer 60 is formed on predetermined portions of the wiring portions 31 and 32 where plating films 41 and 42 are not to be formed. The insulating layer 60 may be made of a white colored material. For example, the insulating layer 60 may be formed by a screen printing method or the like. After forming a white ink or the like so as to cover the wiring 30 in its entirety, the insulating layer 60 may be formed by exposing parts, on which the plating films 41 and 42 are to be formed, on the white ink or the like.

Figure 6C:
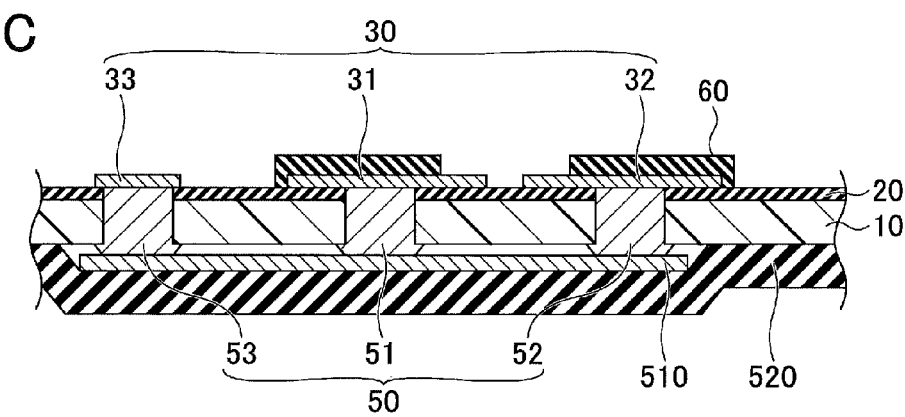

Next, referring to FIG. 6C, masking tape 520, to which copper foil 510 is attached, is adhered to the other surface of the substrate 10. The copper foil 510 contacts the lower ends (in the vicinity of top ends of the protruding portions) of the through wirings 51, 52 and 53. With this, the protruding portions (connection terminals) of the through wirings 51 and 52 and the protruding portion of the through wiring 53 contact the copper foil 510 being the conductor thereby electrically connecting the through wirings 51 and 52 (the first through wiring) with the through wiring 53 (the second through wiring). Thus, the lower surface of the substrate is completely covered by the masking tape 520.

Figure 6D:
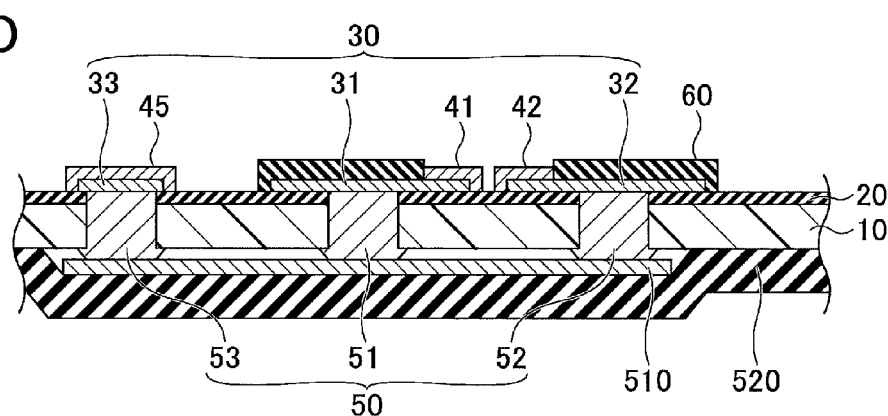

Next, referring to FIG. 6D, electroplating is performed using a power supply route including the bus line 33, the through wiring 53, the copper foil 510, and the through wirings 51 and 52 to thereby form the plating films 41, 42, 43, and 44 on the surface of the portion exposed on the insulating layer 60 of the wirings 31 and 32. The plating film 45 is formed on the bus line 33. The material, thickness and so on of the plating films 41, 42, 43, 44, and 45 are as described above.

After the process illustrated in FIG. 6D, the masking tape 520, to which the copper foil 510 is attached, is removed and diced at predetermined positions by cutting in directions perpendicular to the longitudinal direction of the substrate 10. The light-emitting element mounting package 1 illustrated in FIGS. 1 and 2 is completed.

The light emitting package 100 illustrated in FIG. 3 can be formed as follows. For example, the light-emitting element mounting package 1 is installed in an apparatus. Then, cream solder is coated on the plating films 41 and 42 of each of the individual package areas C. The bumps 111 and 112 of each light-emitting element 110 are arranged on the cream solder of the plating films 41 and 42 of each of the individual package areas C. Thereafter, the light-emitting element package 100 is brought through a reflow furnace to melt the cream solder and harden it.

Thereafter, after sealing an upper surface of the light-emitting element mounting package 1 with the sealing resin 120, a part of each individual package area C is cut out along the respective boundary division to be diced into the individual package areas C. Or, the parts of the individual package areas C are diced. Then, the part of each individual package area C is sealed by the sealing resin 120. Thereafter, each diced light-emitting element mounting package 1 is mounted on a metallic substrate 125 including the metallic plate 130, the insulating layer 140, the wiring layer 150, and so on. Specifically, by electrically connecting protruding portions (connection terminals) of the through wirings 51 and 52 to the pads 150A, the light-emitting element package 100 illustrated in FIG. 3 is completed.

As described, in the light-emitting element mounting package 1, the through wirings 51 and 52 are used as a route for electrically connecting the wirings 31 and 32 and also as a heat radiation route for heat generated by the light-emitting element 110. With this, the heat generated by the light-emitting element 110 can be transferred to the radiator portion (the metallic plate 130) to radiate heat. At this time, because the through wirings 51 and 52 are arranged immediately below the light-emitting element mounting portion (the wirings 31 and 32), the heat generated by the light-emitting element 110 can be efficiently transferred to the radiator portion (the metallic plate 130) in order to radiate the heat.

Further, because the through wirings 51 and 52 are arranged immediately below the light-emitting element mounting portion to thereby improve a heat radiation property, the wiring may not be thickened as in a conventional technique in order to improve the heat radiation property. As a result, it is possible to use a relatively thin copper foil having a thickness of about 12 μm to about 35 μm as the wiring 30. Thus, it is possible to narrow the interval between the wirings 31 and 32 to be, for example, 60 μm.

Further, there may be degradation of connection reliability between the light-emitting element and the light-emitting element mounting portion in the conventional light-emitting element package, because of mismatching of coefficients of thermal expansion of the light-emitting element and the radiator plate. On the other hand, in the light-emitting element package 100, the substrate 10 including a resin having flexibility as a major component is arranged between the light-emitting element 110 and the metallic plate 130 functioning as the radiator plate. Therefore, connection reliability between the light-emitting element 110 and the light-emitting element mounting portion can be improved by relaxing mismatching between the coefficients of thermal expansion of the light-emitting element 110 and the metallic plate 130.

[b] Second Embodiment

Within the second embodiment, an exemplary method of manufacturing the light-emitting element mounting package different from that in the first embodiment is described. In the second embodiment, explanation of constructional elements the same as those described in the above description of the first embodiment is omitted.

Figure 7:
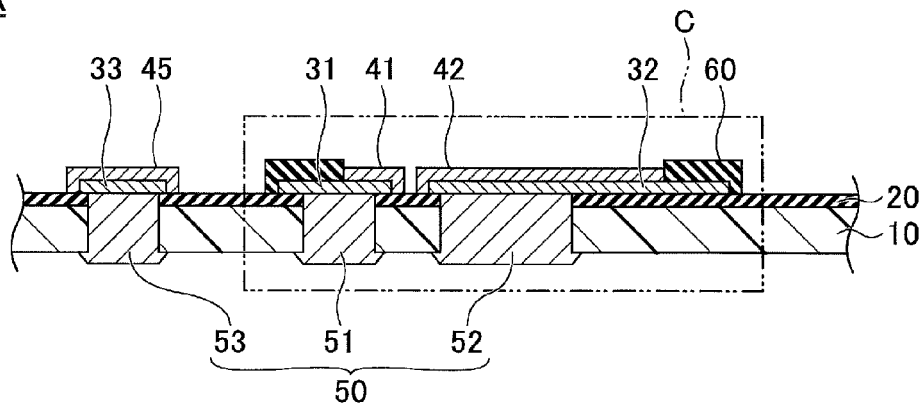
FIG. 7 is an exemplary cross-sectional view of a light-emitting element mounting package of a second embodiment.
Figure 8:
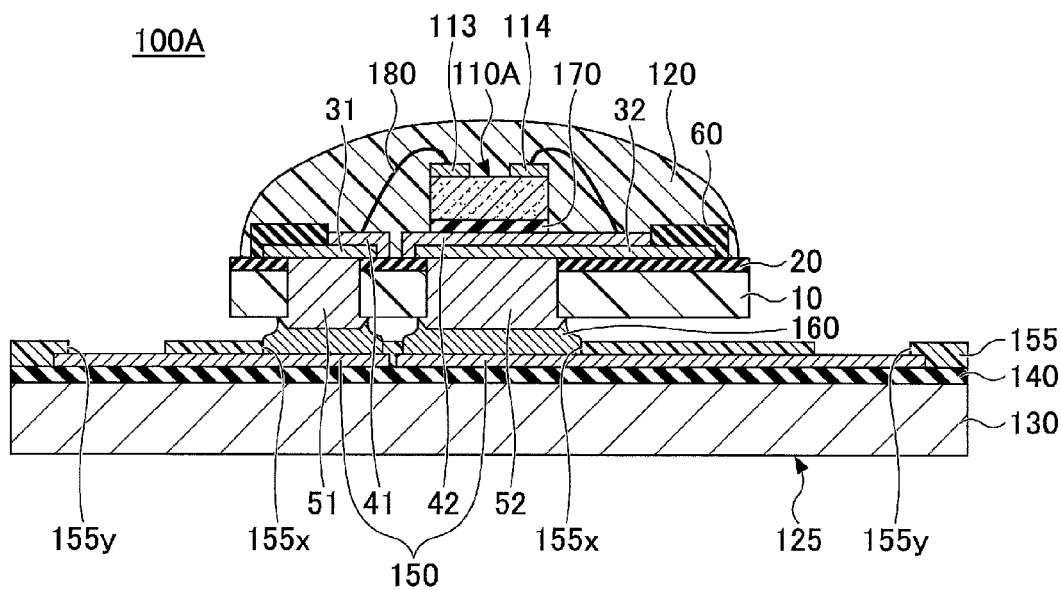
FIG. 8 is an exemplary cross-sectional view of the light-emitting element package of the second embodiment.

FIG. 7 is an exemplary cross-sectional view of a light-emitting element mounting package 1A of the second embodiment. FIG. 8 is a cross-sectional view of a light-emitting element package 100A of the second embodiment.

Referring to FIG. 7, a schematic structure of the light-emitting element mounting package 1A is similar to that of the light-emitting element mounting package 1 of the first embodiment (see FIGS. 1 and 2). However, in the light-emitting element mounting package 1A, the area of an upper surface of a wiring 32 and the area of an upper surface of a plating film 42 are greater than the area of an upper surface of a wiring 31 and the area of an upper surface of a plating film 41.

Further, the cross-sectional area of the through wiring 52 is greater than the cross-sectional area of the through wiring 51. The reason is that a light-emitting element 110A is mounted by wire bonding in the light-emitting element mounting package 1A, as in the light-emitting element package 100A illustrated in FIG. 8.

Said differently, in the light-emitting element mounting package 1A after dicing, the light-emitting element 110A is mounted on the plating film 42 via the adhesive layer 170 (a lower surface of the light-emitting element 110A is adhered onto the plating film 42 by an adhesive layer 170). Further, an electrode 113 provided on an upper surface of the light-emitting element 110A is electrically connected to the plating film 41 via a metallic wire 180 (the bonding wire) made of gold (Au), copper (Cu), or the like. Further, another electrode 114 provided on the upper surface of the light-emitting element 110A is electrically connected to the plating film 42 via the metallic wire 180 (the bonding wire) made of gold (Au), copper (Cu), or the like. The light-emitting element 110A and the metallic wire 10 are sealed by the sealing resin 120.

The adhesive layer 170 may be an insulative adhesion bond, an adhesive film (e.g., a die attach film), or the like. However, when the lower surface of the light-emitting element 110A is insulated from the electrodes 113 and 114 and a chip portion (not illustrated), which is a major component of the light-emitting element 110A, a conductive adhesion bond made of silver paste or the like may be used as the adhesive layer 170.

As described, within the second embodiment, the light-emitting element mounting package 1A, can have mounted the light-emitting element 110A electrically connected by wire bonding when the areas or the like of the upper surfaces are designed to be appropriate sizes.

In the light-emitting element mounting package 1A, the cross-sectional area of the through wiring 52, which is provided at a position corresponding to a back surface of the light-emitting element 110A, can be designed to be great. Thus, the heat radiation efficiency can be improved. Said differently, heat generated by the light-emitting element 110A is transferred to the through wiring 52 from the back surface of the light-emitting element 110A via the plating film 42 and the wiring 32. Further, the heat is efficiently transferred from the through wiring 52 having the great area to the pad 150A, the insulating layer 140, and the metallic plate 130. Then, the heat is radiated by the metallic plate 130.

Modified Example of Second Embodiment

Within the modified example of the second embodiment, an exemplary structure of a light-emitting element mounting package different from that in the second embodiment is described. In the modified example of the second embodiment, explanation of constructional elements the same as those described in the above description of the first and second embodiments is omitted.

Figure 9:
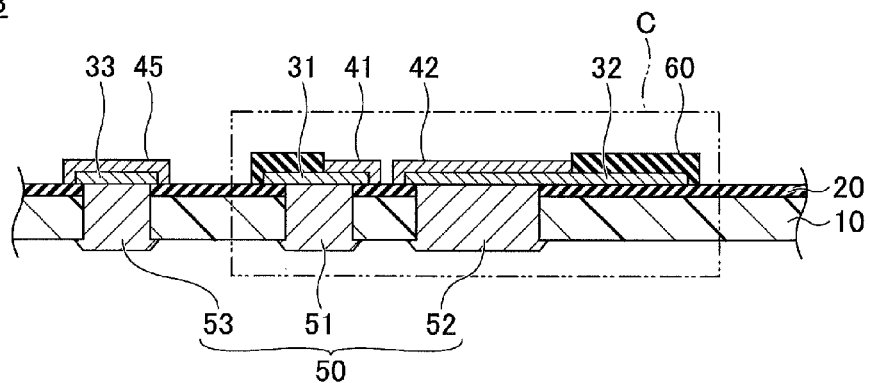
FIG. 9 is an exemplary cross-sectional view of a light-emitting element mounting package of a modified example of the second embodiment.
Figure 10:
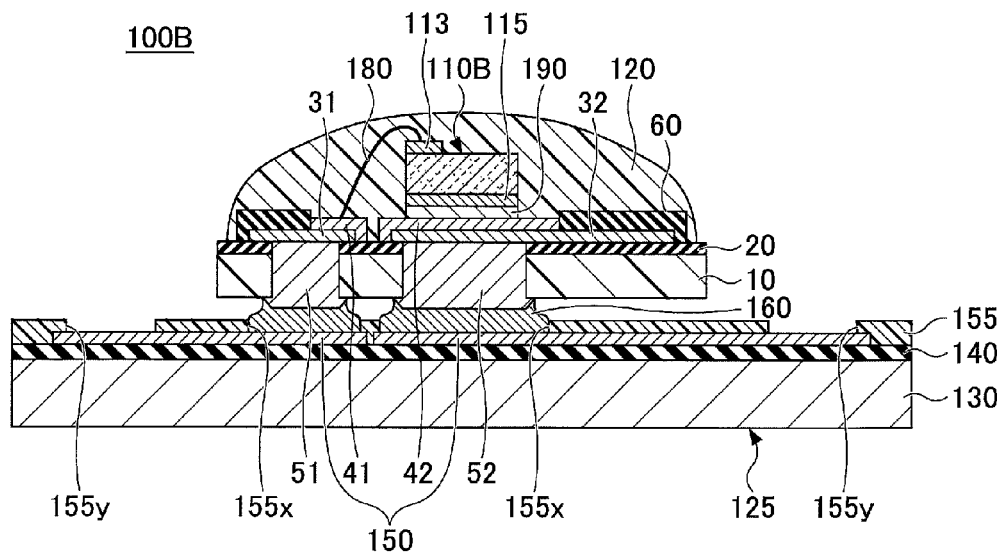
FIG. 10 is an exemplary cross-sectional view of the light-emitting element package of the second embodiment.

FIG. 9 is an exemplary cross-sectional view of a light-emitting element mounting package 1B of the modified example of the second embodiment. FIG. 10 is a cross-sectional view of a light-emitting element package 100B of the modified example of the second embodiment.

Referring to FIG. 9, a schematic structure of the light-emitting element mounting package 1B is similar to that of the light-emitting element mounting package 1A of the second embodiment (see FIG. 7). However, in the light-emitting element mounting package 1B, the area on an upper surface of a plating film 42 is smaller than that in the light-emitting element mounting package 1A. The reason is that only one of electrodes of a light-emitting element 110B is connected by wire bonding to the light-emitting element mounting package 1B, as in the light-emitting element package 100B illustrated in FIG. 10. Therefore, an area connecting the other electrode of the light-emitting element 110B by wire bonding is not provided.

In the light-emitting element package 100B, one of the electrodes 113 is provided on the upper surface of a light-emitting element 110B. The other one of the electrodes 115 is provided on the lower surface of the light-emitting element 110B. In the light-emitting element mounting package 1B, the light-emitting element 110B is mounted on the plating film 42 via the conductive adhesive layer 190 made of, for example, silver paste or the like. With this, the other electrode 115 is electrically connected to the plating film 42 via the conductive adhesive layer 190.

The electrode 113 of the light-emitting element 110B is electrically connected to the plating film 41 via the metallic wire 180 in a manner similar to the second embodiment. The light-emitting element 110B and the metallic wire 180 are sealed by the sealing resin 120 in a manner similar to the second embodiment.

As such, the electrode 115 is provided on the lower surface of the light-emitting element 110B to thereby electrically connect the electrode 115 with the plating film 42 via the conductive adhesive layer 190. Thus, an effect similar to the second embodiment is obtainable.

[c] Third Embodiment

Within the third embodiment, an exemplary manufacturing method of a light-emitting element mounting package different from that in the first embodiment is exemplified. In the third embodiment, explanation of constructional elements the same as those described in the above embodiments is omitted.

Structure of Light-Emitting Element Mounting Package of Third Embodiment

Figure 11:
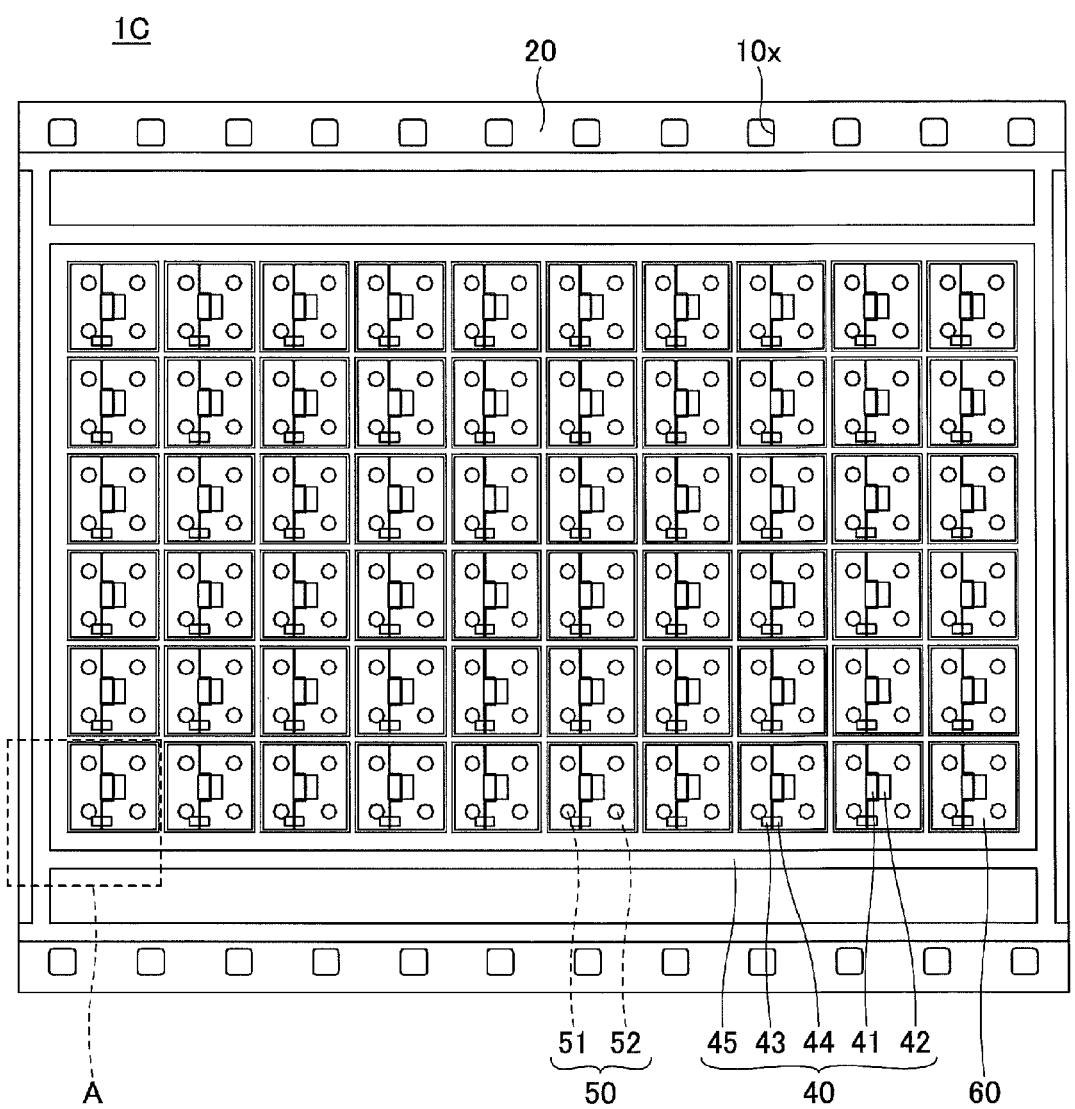
FIG. 11 is an exemplary plan view of a light-emitting element mounting package of a third embodiment.
Figure 12A:
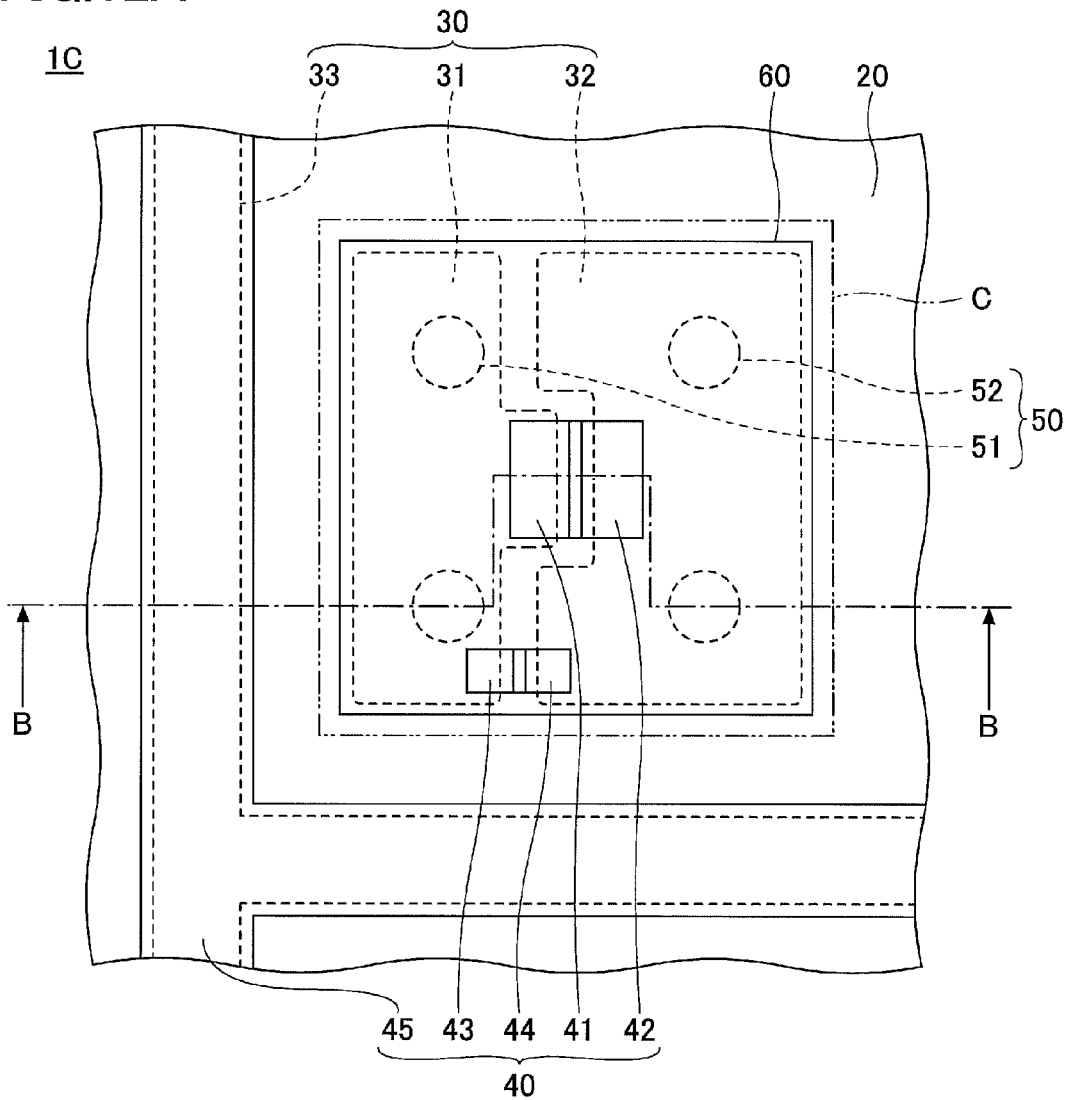
FIGS. 12A and 12B are exemplary enlarged views illustrating a part A of FIG. 11.
Figure 12B:
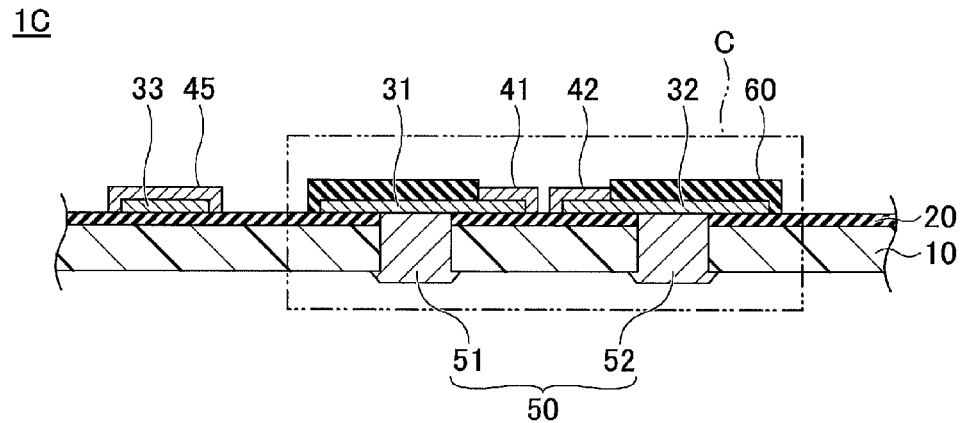

The structure of a light-emitting element mounting package of a third embodiment is described. FIG. 11 is an exemplary plan view of the light-emitting element mounting package of the third embodiment. FIG. 12A is an exemplary enlarged plan view of a portion A (surrounded by a broken line) of FIG. 11. FIG. 12B is an exemplary cross-sectional view taken along a line B-B of FIG. 12A.

Referring to FIG. 11 and FIGS. 12A and 12B, the light-emitting element mounting package 1C differs from the light-emitting element mounting package 1 (see FIGS. 1, 2A, and 2B) at a point that the through wirings 53 are not provided in the bus line 33. The reason why the through wirings 53 are not provided is described in an explanation of the manufacturing method of the light-emitting element mounting package. The package structure of the light-emitting element mounting package 1C after dicing is similar to that of the light-emitting element mounting package 1.

Figure 13A:
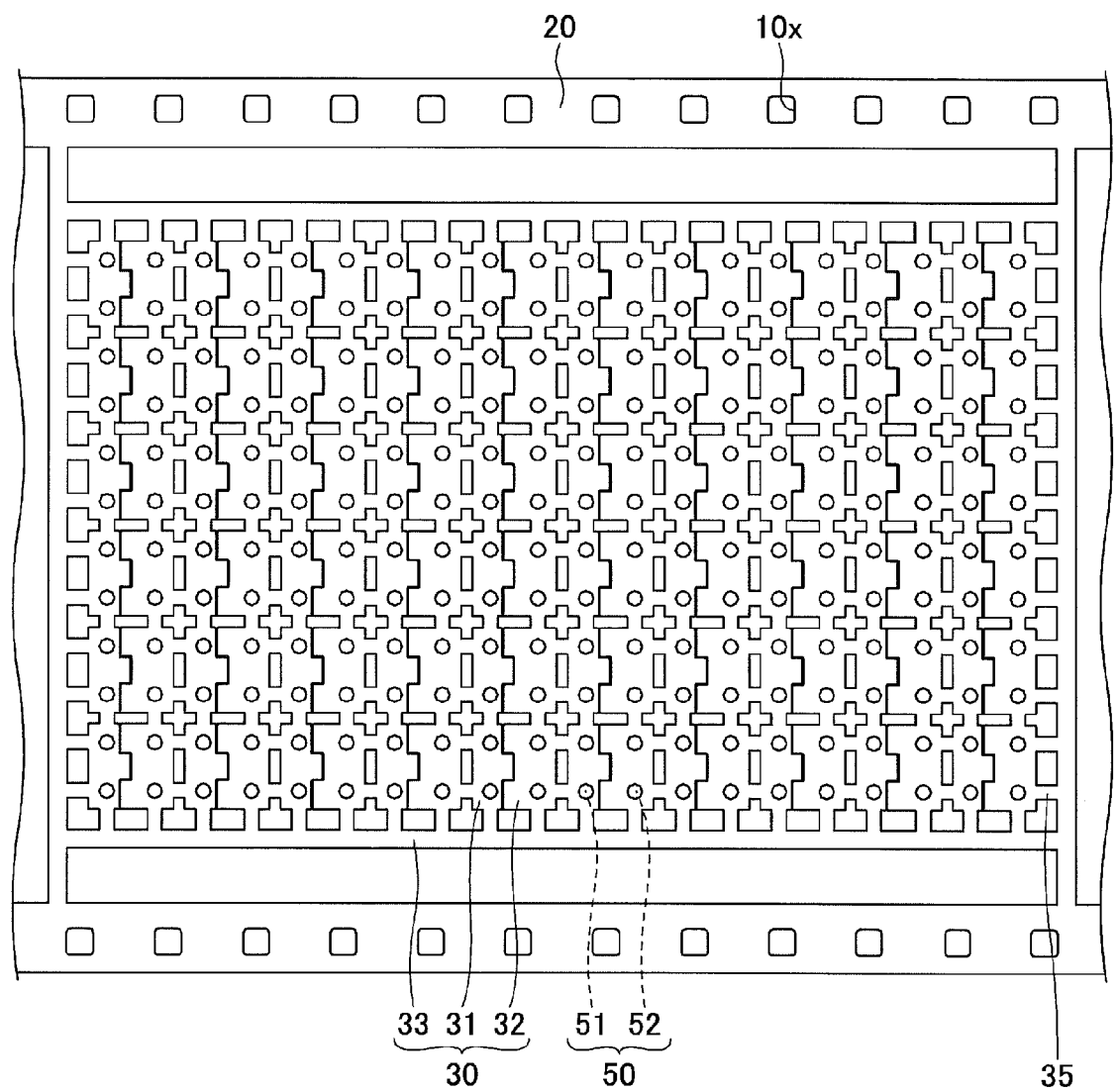
FIGS. 13A and 13B illustrate an exemplary manufacturing process of a light-emitting element mounting package of the third embodiment.
Figure 13B:
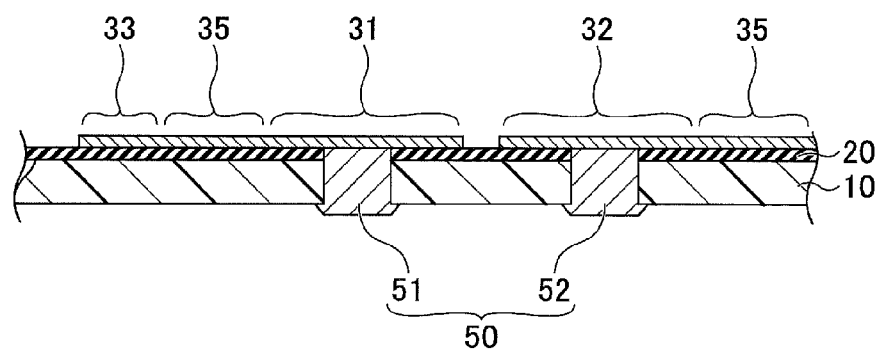
Figure 14A:
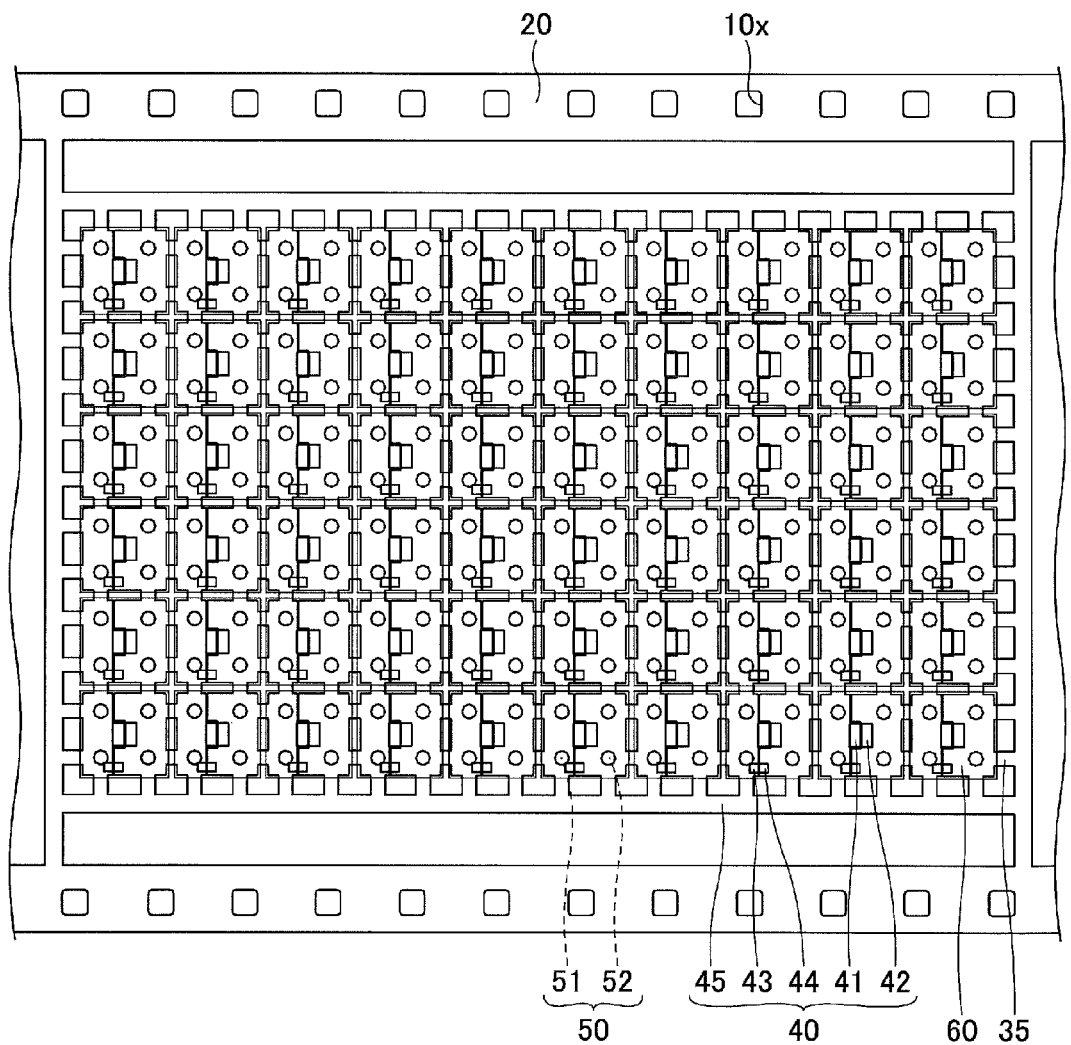
FIGS. 14A and 14B illustrate the exemplary manufacturing process of the light-emitting element mounting package of the third embodiment.
Figure 14B:
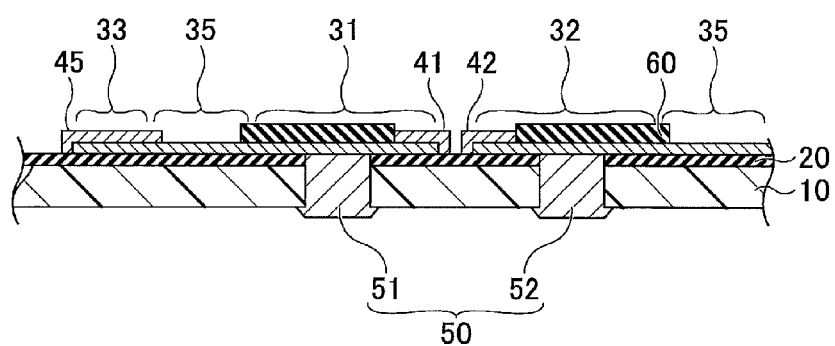

Method of Manufacturing Light-Emitting Element Mounting Package of Third Embodiment Next, the method of manufacturing the light-emitting element mounting package of the third embodiment is described. FIGS. 13A, 13B, 14A, and 14B illustrate the manufacturing process of the light-emitting element mounting package of the third embodiment. FIGS. 13A and 14A are exemplary plan views, and FIGS. 13B and 14B are exemplary cross-sectional views.

Referring to FIG. 13B, processes similar to those in the first embodiment illustrated in FIGS. 4A to 6A are carried out. However, in the process corresponding to FIGS. 4A and 4B, the through holes 50 are not formed in an area corresponding to the bus line 33. In the process corresponding to FIG. 6A, the wiring 30 is formed from the metallic layer 30A and simultaneously connecting portions 35 are formed.

The connecting portions 35 are formed to electrically connect bus line 33 and the wirings 31 or 32 mutually adjacent, adjacent wirings 31, adjacent wirings 32, and adjacent wirings 31 and 32. With this, only on one side of the substrate 10, all the wirings 31 and 32 are electrically connected to the bus line 33. As described, because the bus line 33 is electrically connected with the wirings 31 and 32 only on one side of the substrate 10, a conductor is not used on the other surface of the substrate 10. Thus, the through wirings 53 are not provided.

Referring to FIGS. 14A and 14B, processes similar to those of the first embodiment illustrated in FIGS. 6B to 6D are carried out to thereby form plating films 41, 42, 43, and 44 on surfaces of the wirings 31 and 32 exposed on the insulating layer 60. The plating film 45 is formed on the bus line 33.

Next, referring to FIG. 6C, the masking tape 520, to which the copper foil 510 is not attached, is adhered to the other surface of the substrate 10. One surface of the masking tape 520 contacts the lower ends (in the vicinity of top ends of the protruding portions) of the through wirings 50. Thus, the other surface of the substrate 10 is completely covered by the masking tape 520. In the process corresponding to FIG. 6D, electric power is supplied to the wirings 31 and 32 via the bus line 33 and the connecting portion 35 to thereby form the plating films 41, 42, 43, and 44. At this time, the masking tape is attached onto the connecting portion 35 thereby preventing the plating film from being formed on the connecting portion 35. This is because the connection portion 35 is easily removed.

After the process illustrated in FIGS. 14A and 14B, the connecting portion 35 illustrated in FIG. 14B is removed, and further the masking tape 520 is removed. By cutting the substrate 10 to dice in directions perpendicular to the longitudinal direction at predetermined positions, the light-emitting element mounting packages 1C illustrated in FIGS. 11 and 12 are completed. For example, the connecting portion 35 can be removed by masking areas other than the connection portion 35 and wet etching or dry etching the connecting portion 35. Or, the connection portion 35 may be removed by blasting.

As described, within the third embodiment, the connecting portions 35 are provided to connect the bus line 33 with the wirings 31 and 32 on the one surface of the substrate 10. Further, the plating films 41, 42, 43, and 44 are formed on the wirings 31 and 32. Effects similar to those in the first embodiment is obtainable in the light-emitting element mounting package 1C manufactured as described above.

Further, the connecting portions 35 are removed by etching before dicing the light-emitting element mounting packages 1C to thereby prevent the connecting portion from being left at portions cut in dicing to obtain the light-emitting element mounting packages 10. Because edges of the wirings 30 are not exposed on end portions of the light-emitting element mounting packages 1C obtained by dicing, a problem such as short-circuit, rust, or the like does not occur.

[d] Fourth Embodiment

Within the fourth embodiment, another exemplary structure of the light-emitting element mounting package different from that in the first embodiment is exemplified. In the fourth embodiment, explanation of constructional elements the same as those described in the above embodiments is omitted.

Structure of Light-Emitting Element Mounting Package of Fourth Embodiment

Figure 15:
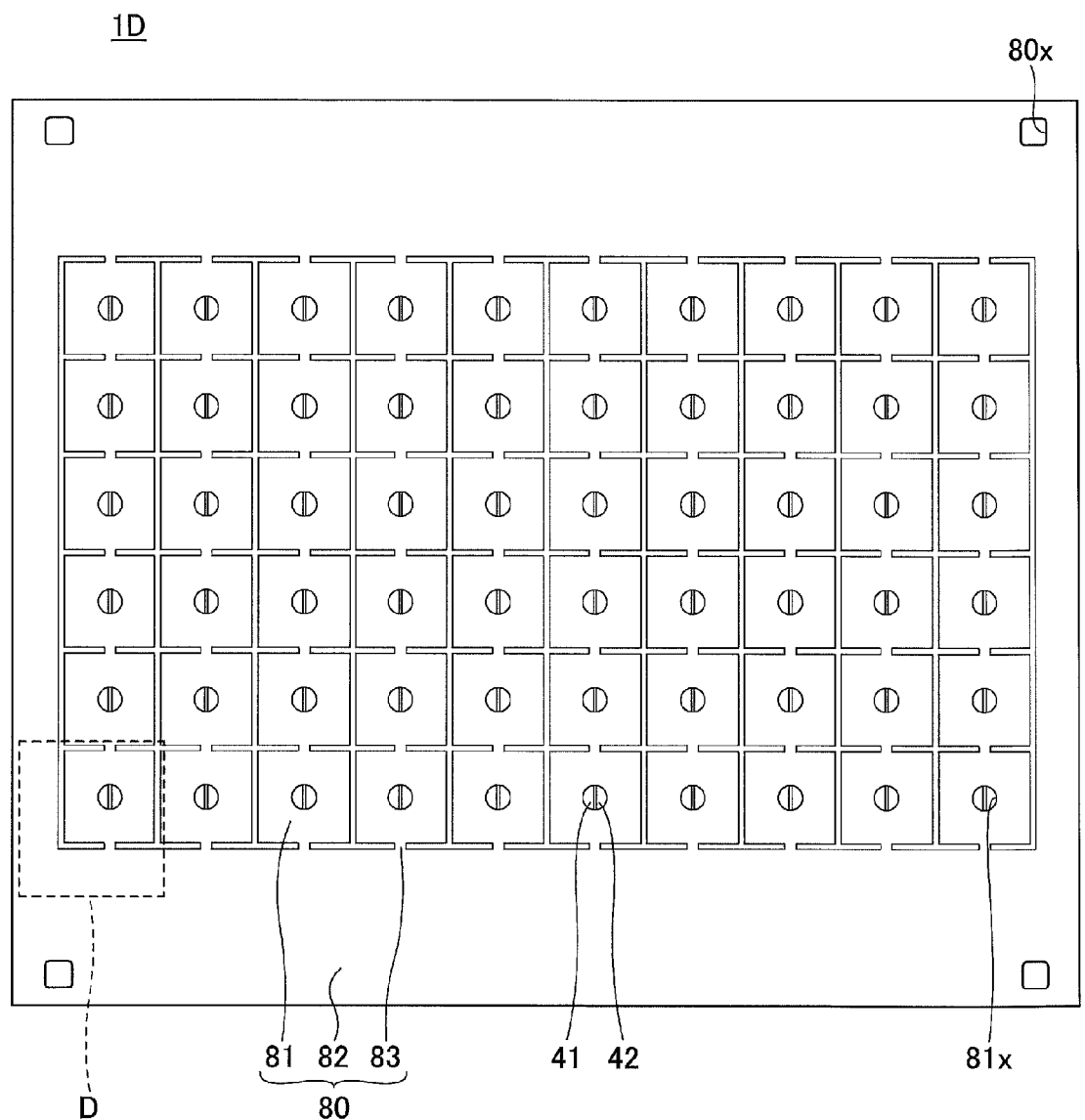
FIG. 15 is an exemplary plan view of a light-emitting element mounting package of a fourth embodiment.
Figure 16A:
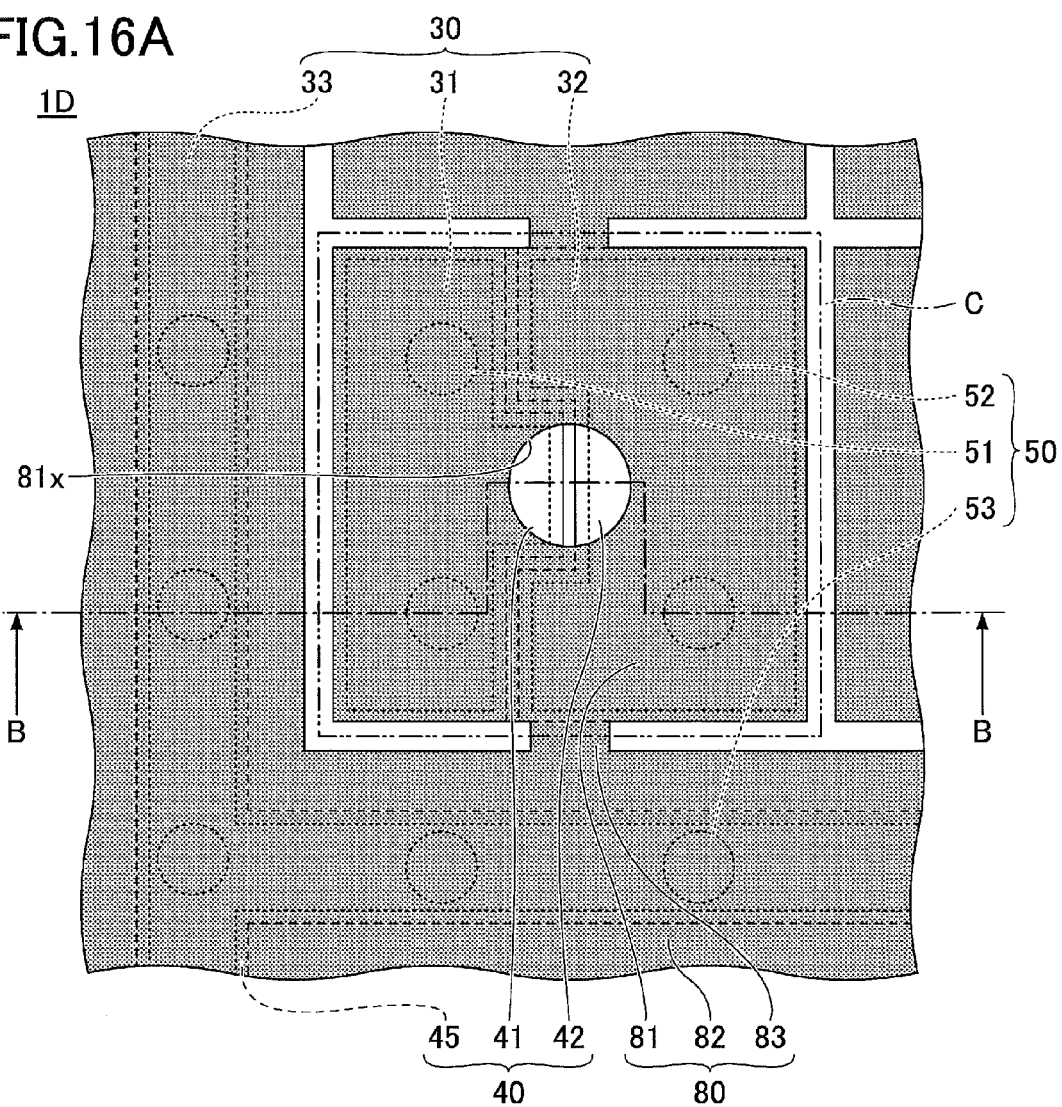
FIGS. 16A and 16B are exemplary enlarged views illustrating a part D of FIG. 15.
Figure 16B:
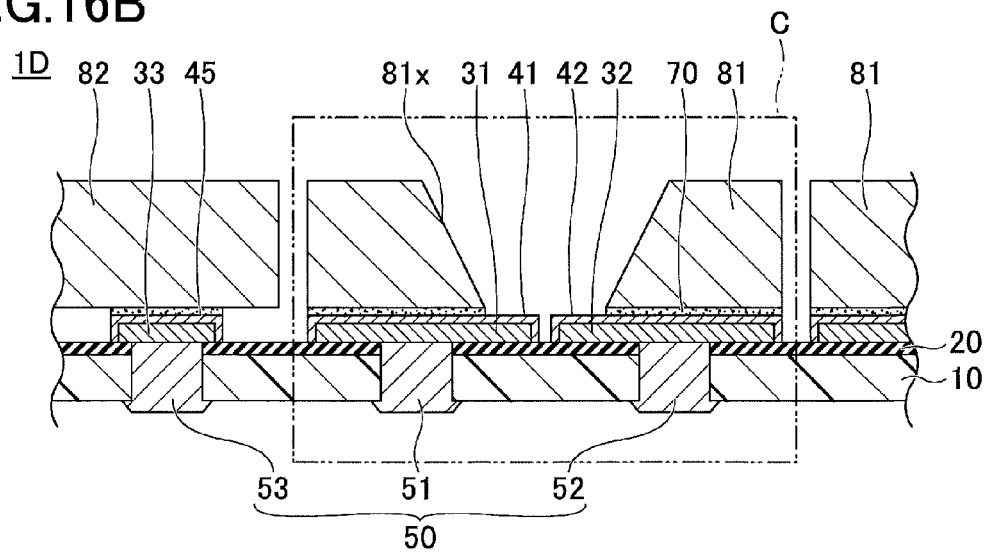

The structure of a light-emitting element mounting package of the fourth embodiment is described. FIG. 15 is an, exemplary plan view of the light-emitting element mounting package of the fourth embodiment. FIGS. 16A and 16B are exemplary enlarged views of a portion D (surrounded by a broken line) of FIG. 15. FIG. 16A is a plan view. FIG. 16B is a cross-sectional view taken along a line B-B of FIG. 16A. For convenience, the metallic member 80 is patterned by dots in FIG. 16A.

Referring to FIG. 15 and FIGS. 16A and 16B, the light-emitting element mounting package 1D mainly differs from the light-emitting element mounting package 1 (see FIGS. 1, 2A, and 2B) at a point that metallic members 80 are provided on the surface of the light-emitting element mounting package 1D instead of the insulating layer 60.

A plating film 41 is formed to cover the upper and side surfaces of a wiring 31 in the light-emitting element mounting package 1D. Further, the plating film 41 is formed to cover the upper and side surfaces of a wiring 32. In a manner similar to the first embodiment, a plating film 45 is formed to cover the upper surface and the side surface of the bus line 33. On an area where the plating films 43 and 44 are formed in the first embodiment, the plating films 41 and 42 are formed in the fourth embodiment. Therefore, in the fourth embodiment, the plating films 43 and 44 do not exist.

The metallic members 80 are adhered onto the plating films 40 (the plating films 41, 42, and 45) via an adhesive layer 70. For example, the adhesive layer 70 is an adhesion bond made of an insulative resin such as an epoxy adhesion bond, silicone adhesion bond, or a polyimide adhesion bond. When necessary, an insulating heat resistant adhesion bond may be used as the adhesion layer 70. The thickness of the adhesive layer 70 is, for example, about 8 µm to about 18 µm. The adhesive layer 70 may be an adhesion bond of a type the same as the adhesion layer 20 or an adhesion bond of a type different from the adhesion layer 20.

In the light-emitting element mounting package 1D, plural individual package areas C to be individual light-emitting element mounting packages as a result of dicing are longitudinally and laterally arranged on the substrate 10. The metallic member 80 includes plural reflection plates 81 longitudinally and laterally arranged while interposing a predetermined interval, a frame portion 82 entirely surrounding the reflection plates 81, and hung portions 83 connecting the reflection plates 81, the frame portion 82, and the hung portions 83. The reflection plates 81 are arranged on each light-emitting element mounting portion inside each individual package area C. The reflection plates 81, the frame portion 82, and the hung portions 83 are integrally formed.

In the fourth embodiment, the hung portion 83 may be provided only in one direction (the longitudinal direction on FIG. 16A). The hung portion may be provided only in the lateral direction or in the longitudinal and lateral directions on FIG. 16A. Sprocket holes 80x functioning in a manner similar to the sprocket holes 10x are provided in the frame portion 82 of the metallic member 80.

The opening portions 81x are provided to expose a part of each of the plating films 41 and 42 on the reflection plates 81 of the metallic member 80. The plating films 41 and 42 exposed on each opening portion 81x function as a connecting portion of one of the electrodes of the light-emitting element and a connecting portion of the other one of the electrodes of the light-emitting element. An inner wall of the opening portion 81x is a slant surface which is shaped like a horn to be widened toward the upper surface. When the light-emitting element is mounted on the plating films 41 and 42, which are exposed inside the opening portion 81, the inner wall functions to reflect light emitted by the light-emitting element in a predetermined direction.

A slant angle of the inner wall surface of the opening portion 81x relative to the upper surface of the plating film 40 can be appropriately set. The slant angle is about 20° to about 50°. However, a cross-sectional shape of the inner wall of the opening portion 81x is not limited to a linear shape and may include a curved portion. In a viewpoint of improving a reflectance ratio, the planar shape of the opening portion 81x is preferably small. The opening portion 81x is in a circular shape in its plan view. For example, the diameter of the opening portion may be about several mm. However, the planar shape of the opening portion 81x is not limited to a circle and may be an ellipse, a rectangle, or the like.

For example, the thickness of the metallic body 80 may be about 0.5 mm. The material of the metallic member 80 is copper, aluminum, an alloy of copper and aluminum, or the like. At this time, by polishing the surface of the metallic member 80 to give further gloss to the surface, the reflectance ratio inside the inner wall surface of the opening portion 81x becomes preferably high when the light-emitting element is mounted and emits light.

By providing gold plating, silver plating, or the like on the surface of the metallic member 80, the gloss may be further enhanced. At this time, it is preferable to select a plating material having a high reflectance ratio relative to an emission wavelength of light emitted from the light-emitting element. Polishing or plating may be provided to the entire metallic member 80 or only a limited area such as only the inner wall surface of the opening portion 81x.

Another opening portion different from the opening portion 81x may be provided in the area where the plating films 43 and 44 are formed. Then, the other opening portion has the plating films 41 and 42 exposed on the other opening portion to enable mounting a protecting part such as a Zener diode on the plating films 41 and 42.

Figure 17:
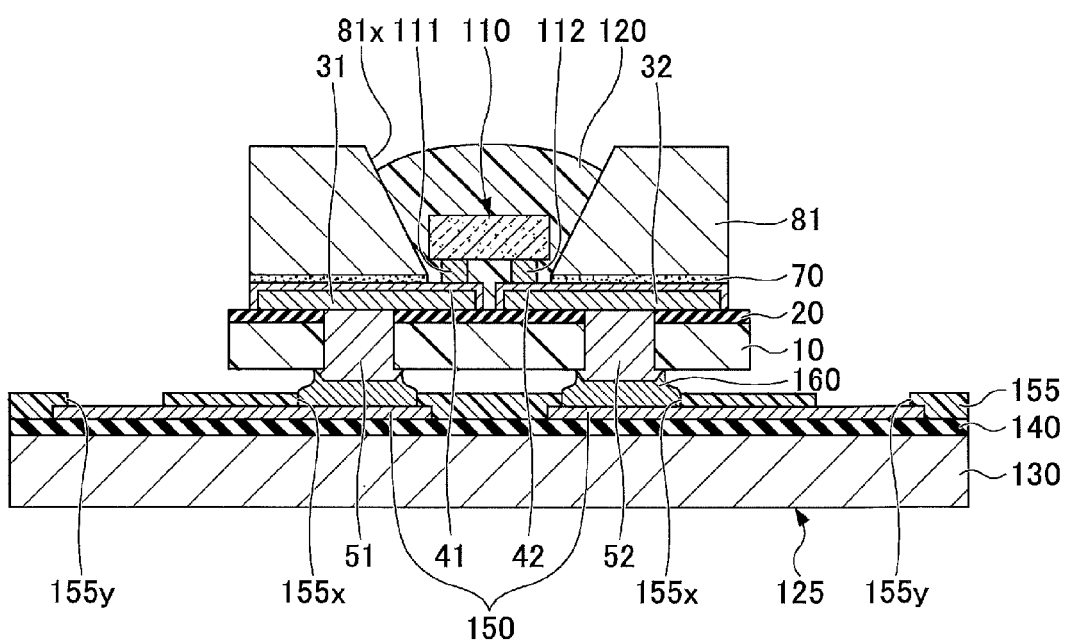
FIG. 17 is an exemplary cross-sectional view of the light-emitting element package of the fourth embodiment.

FIG. 17 is a cross-sectional view of the light-emitting element package of the fourth embodiment. Referring to FIG. 17, the light-emitting element 110 is mounted on a light-emitting element mounting portion (the wirings 31 and 32) of the light-emitting element mounting package 1D after dicing (a portion of the individual package area C). Then, the light-emitting element 110 is sealed by a sealing resin 120 and further mounted on the metallic substrate 125. The sealing resin 120 is provided inside the opening portion 81x of the reflection plate 81.

Within the fourth embodiment, because the inner wall surface of the opening portion 81x is the slanted surface, it is possible to effectively reflect the light emitted from the light-emitting element 110 into a predetermined direction (improving a reflectance ratio).

Figure 18A:
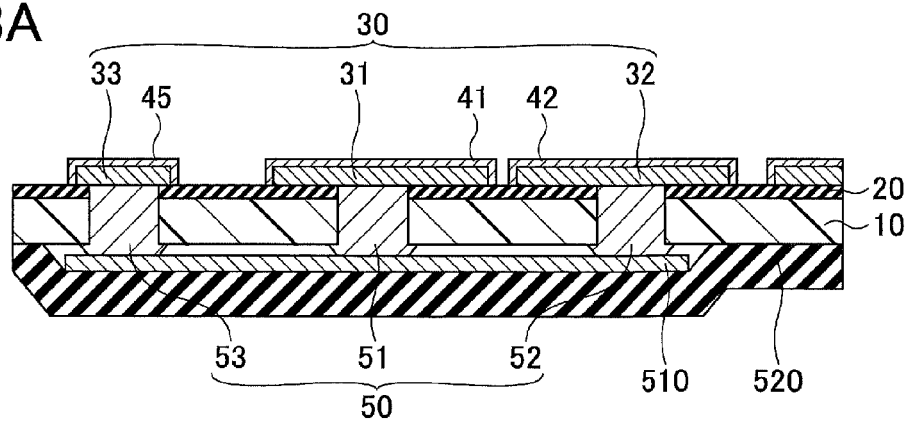
FIGS. 18A, 18B, and 18C illustrate exemplary manufacturing processes of the light emitting element mounting package of the fourth embodiment.
Figure 18B:
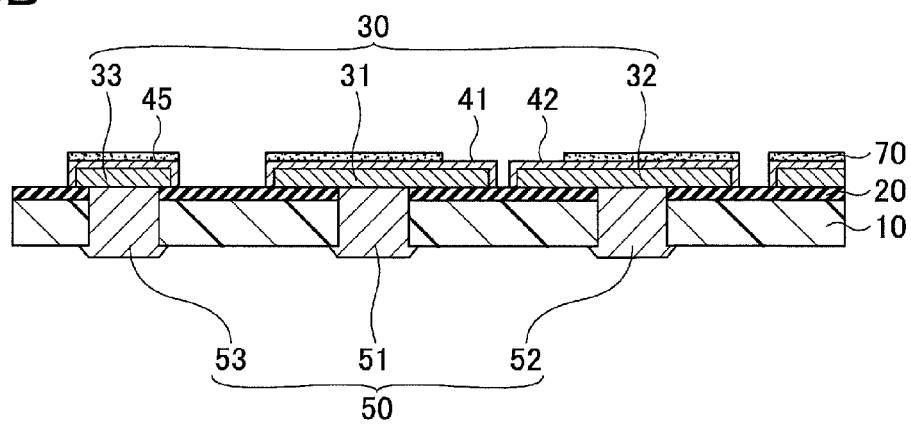
Figure 18C:
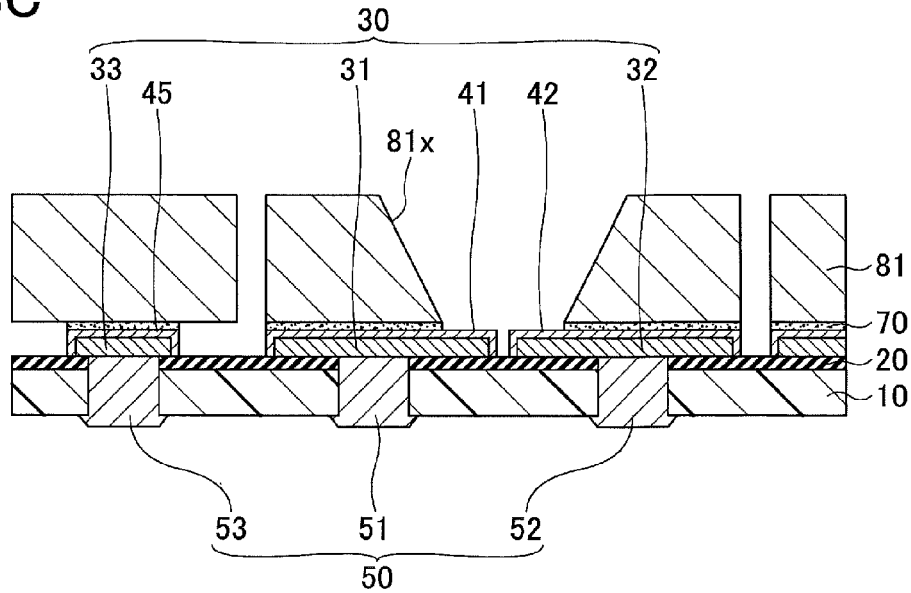

Method of Manufacturing Light-Emitting Element Mounting Package of Fourth Embodiment Next, a method of manufacturing the light-emitting element mounting package of the fourth embodiment is described. FIGS. 18A to 18C illustrate manufacturing processes of the light emitting element mounting package of the fourth embodiment. FIGS. 18A to 18C correspond to FIG. 16.

At first, the processes similar to those illustrated in FIGS. 4A to 6A of the first embodiment are carried out. In the process illustrated in FIG. 18A, the plating films 41, 42, and 45 are formed in a process similar to that illustrated in FIG. 6D. However, because the insulating layer 60 is not formed, the plating film 41 is formed so as to cover the upper surface and the side surface of the wiring 31. Further, the plating film 42 is formed to cover the upper and side surfaces of the wiring 32.

In the process illustrated in FIG. 18B, after removing the masking tape 520, to which the copper foil 510 is attached as illustrated in FIG. 18A, an epoxy adhesion bond or the like is coated on predetermined areas on the plating films 41, 42, and 45 to thereby form the adhesion layer 70. Instead of an epoxy adhesion bond, an epoxy adhesive film may be adhered to form the adhesive layer 70. The predetermined area is other than portions exposed inside the opening portions 81x of the reflection plates 81.

Next, in the process illustrated in FIG. 18C, the metallic member 80 having the opening portions 81x and the hung portions 83 is prepared and adhered onto the plating films 41, 42, and 45 via the adhesive layer 70. The metallic member 80 including the opening portions 81x and the hung portions 83 may be formed by stamping or etching the metallic plate. With this process, the reflection plates 81 of the metallic member 80 are arranged longitudinally and laterally so as to be positioned inside the individual package areas C. The plating films 41 and 42 where the light-emitting element is mounted are exposed inside the opening portions 81x of the reflection plates 81.

By cutting the structure to dice at predetermined positions, the light-emitting element mounting packages 1D illustrated in FIGS. 15, 16A, and 16B are completed. At the time of dicing the structure, the hung portions 83 are cut.

As described, by adhering the metallic member including the reflection plate on the surface of the light-emitting element mounting package, rigidity of the light-emitting element mounting package is improved to reduce deflection, the manufacturing process of the light-emitting element mounting package and handling after shipment becomes easy.

Meanwhile, in a case where the insulating layer 60 made of a white ink or the like is formed as in the first embodiment, the thickness of the insulating layer 60 has a certain value (about 40 μm to about 50 μm) in order to improve a reflectance ratio. However, because the thickness is not obtained by one printing process, plural printing processes are performed. On the other hand, by forming the inner wall surface of the opening portion of the reflection plate to be the slanted surface, light can be efficiently reflected on the slanted surface. Therefore, it is possible to remove a printing process of a white ink or the like. Thus, a manufacturing process of the light-emitting element mounting package can be simplified.

For example, in order to prevent a sealing resin from flowing out when the sealing resin is formed in the manufacturing process of the light-emitting element package 100 in the first embodiment, there is a case where an annular dam is formed on the insulating layer 60 of the individual package areas of the light-emitting element mounting package 1. Within the fourth embodiment, the inner wall surface of the opening portion of the reflection plate functions as the dam for preventing the sealing resin from flowing out when the sealing resin is formed in the manufacturing process of the light-emitting element package. Therefore, a member functioning as the dam is not specifically provided to thereby simplify the manufacturing process of the light-emitting element mounting package or the light-emitting element package.

Meanwhile, because heat generated by the light-emitting element can be radiated from the reflection plate, the heat radiation property of the light-emitting element package can be improved. If more improvement in the heat radiation property is sought, it is preferable to use a metal (copper etc.) having high heat conductivity as the material of the reflection plate. If light weight is sought more, it is preferable to use a metal (aluminum etc.) having low specific gravity as the material of the reflection plate.

Modified Example 1 of Fourth Embodiment

Within the modified example 1 of the fourth embodiment, an example of providing a reflective film on the surface of the reflection plate is described. In the modified example 1 of the fourth embodiment, explanation of component parts the same as those described in the above description of the embodiments is omitted.

Figure 19:
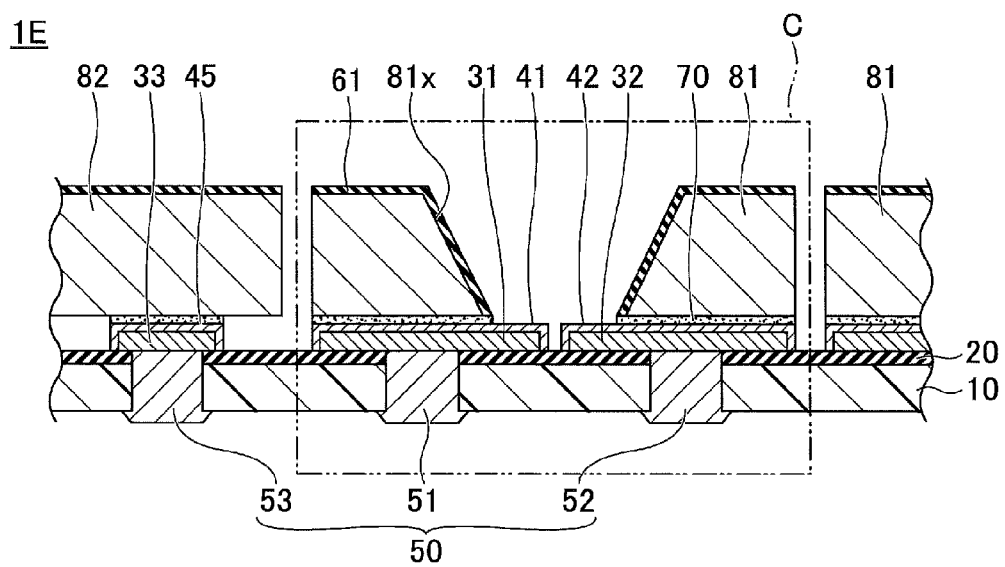
FIG. 19 is an exemplary cross-sectional view of a light-emitting element mounting package of a modified example of the fourth embodiment.
Figure 20:
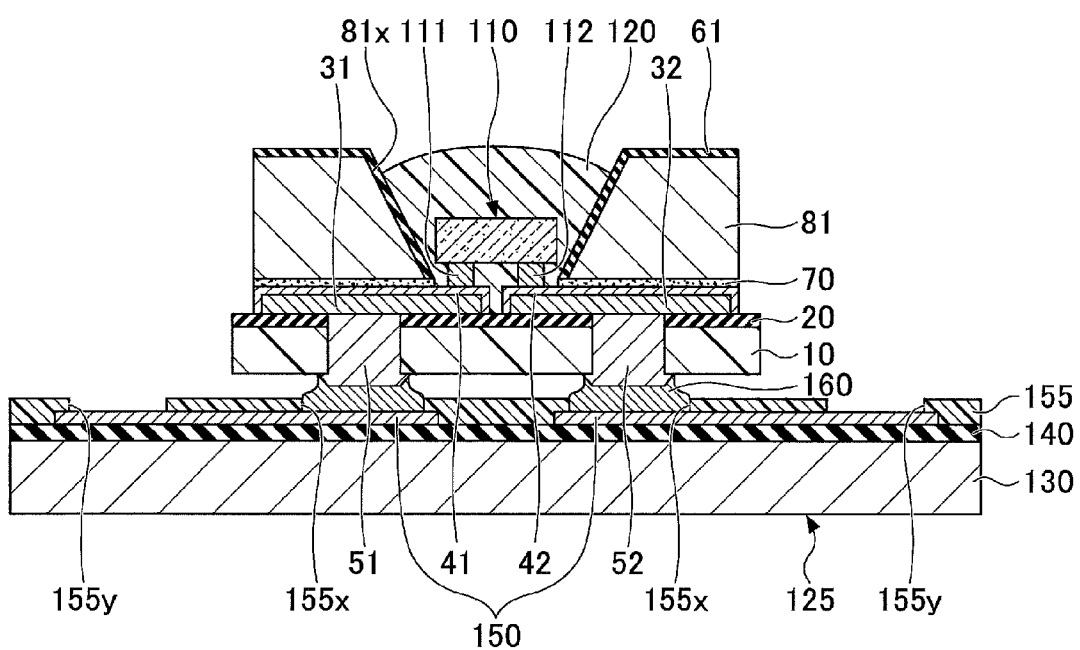
FIG. 20 is an exemplary cross-sectional view of the light-emitting element package of a modified example 1 of the fourth embodiment.

FIG. 19 illustrates a cross-sectional view of a light emitting element mounting package of the modified example 1 of the fourth embodiment. FIG. 19 corresponds to FIG. 16. FIG. 20 illustrates a cross-sectional view of a light emitting element package of the modified example 1 of the fourth embodiment. FIG. 20 corresponds to FIG. 17. Like the light-emitting element mounting package 1E illustrated in FIG. 19 and the light-emitting element package 100E illustrated in FIG. 20, the reflective film 61 may be formed on the upper surface of the reflection plate 81 and the inner wall surface of the opening portion 81x. However, the area formed with the reflective film 61 may only be the inner wall surface of the opening portion 81x.

The material forming the reflective film 61 may be obtained by adding a filler or a pigment such as titanium oxide ($TiO_2$) or barium sulfate ($BaSO_4$) to, for example, an epoxy resin or a silicone resin such as organopolysiloxane. As the material of the reflective film 61, a white ink made of the above material may be used.

The reflective film 61 may be formed by applying a screen printing method or the like to the metallic member 80, in which the opening portions 81x and the hung portions 83 are formed. Further, the reflective film 61 may be formed on the lower surface of the metallic member 80. After arranging the reflective film 61 on the plating films 40, the reflective film 61 is hardened. Thus, the metallic member 80 can be adhered onto the plating film 40 without using the adhesive layer 70. Said differently, the reflection film 61 formed on the lower surface of the metallic member 80 functions as the adhesive layer 70.

Because the reflective film 61 is formed on the metallic member 80, the reflective film 61 may be thin in comparison with the insulating layer 60 of the first embodiment. The thickness of the reflective film 61 may be, for example, about 50 μm. Because the reflective film 61 may be thin, the number of times of printing can be reduced compared to a case where the insulating layer 60 is formed as described in the first embodiment.

As such, by providing the reflective film 61 on the upper surface of the reflection plate 81 and the inner wall surface of the opening portion 81x (or only on the inner wall surface of the opening portion), a high reflectance ratio of the light emitted by the light-emitting element is achieved. Although formation of the reflective film 61 on the upper surface of the frame portion 82 is not described in the modified example 1 of the fourth embodiment, the reflective film 61 may be formed on the upper surface of the frame portion 82 in order to omit a process of masking the frame portion 82 or the like.

Modified Example 2 of Fourth Embodiment

Within the modified example 2 of the fourth embodiment, the areas for forming the plating films 41 and 42 in the fourth embodiment are reduced. In the modified example 2 of the fourth embodiment, explanation of component parts the same as those described in the above description of the embodiments is omitted.

Figure 21:
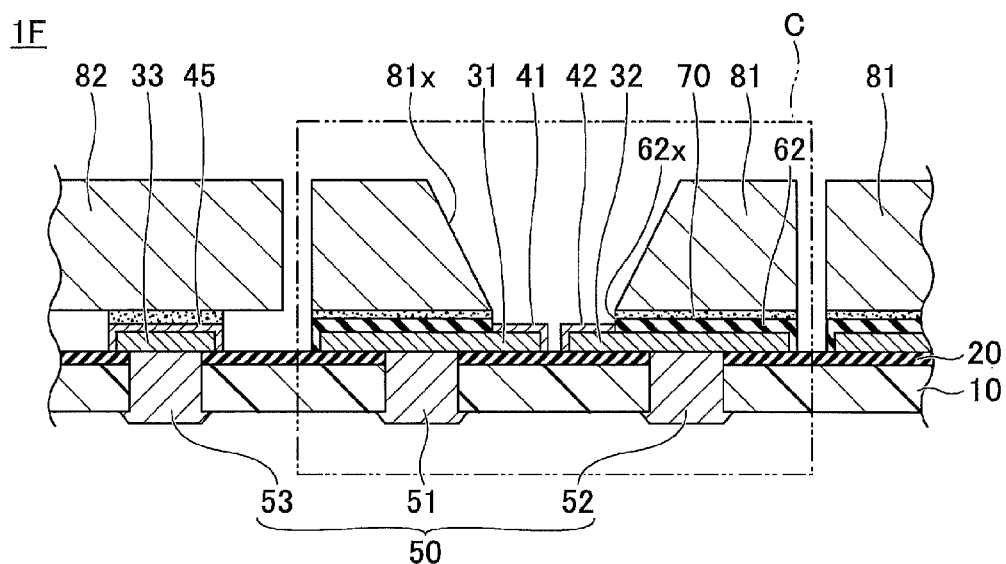
FIG. 21 is an exemplary cross-sectional view of a light-emitting element mounting package of a modified example 2 of the fourth embodiment.
Figure 22:
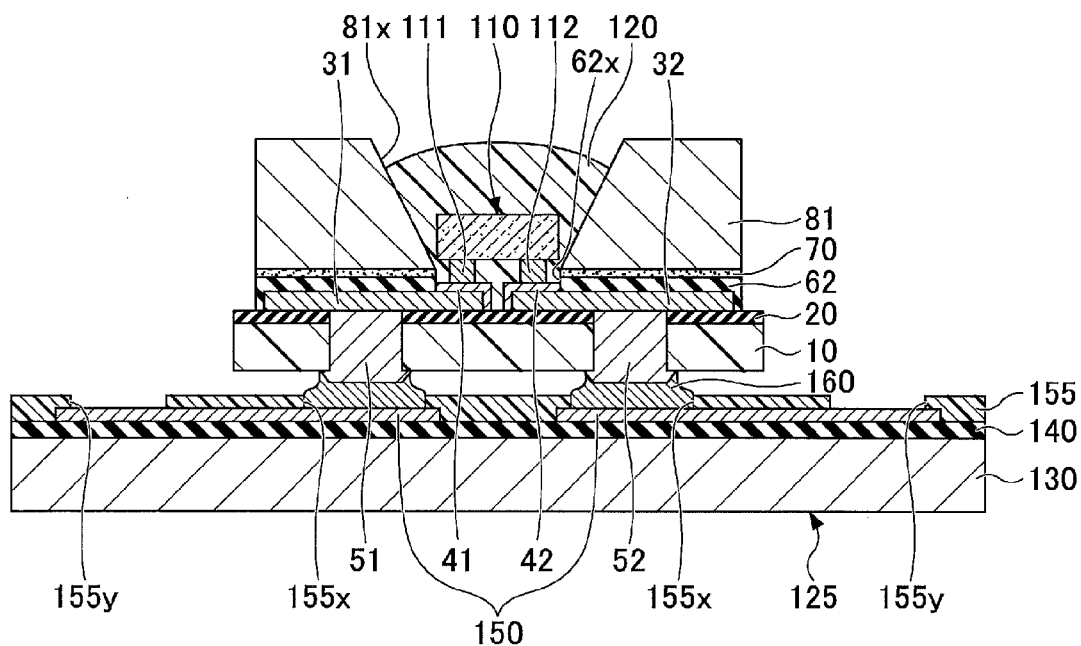
FIG. 22 is an exemplary cross-sectional view of the light-emitting element package of the modified example 2 of the fourth embodiment.

FIG. 21 illustrates a cross-sectional view of a light emitting element mounting package of the modified example 2 of the fourth embodiment. FIG. 21 corresponds to FIG. 16B. FIG. 22 illustrates a cross-sectional view of a light emitting element package of the modified example 2 of the fourth embodiment. FIG. 22 corresponds to FIG. 17. The wirings 31 and 32 may be covered by the solder resist layer 62 except for a part of the area as in the light-emitting element mounting package 1F illustrated in FIG. 21 and the light-emitting element package 100F illustrated in FIG. 22.

The solder resist layer 62 is formed to cover the upper and side surfaces of the wirings 31 and 32 except for portions positioned inside the opening portion 81x. The plating film 41 is formed to cover the portions of the upper and side surfaces of the wiring 31, which are positioned inside the opening portion 81x. The plating film 42 is formed to cover the portions of the upper and side surfaces of the wiring 32, which are positioned inside the opening portion 81x.

The solder resist layer 62 may be formed instead of the insulating layer 60 in the process illustrated in FIG. 6B. Specifically, the solder resist layer 62 can be formed by painting a liquid-like or paste-like photosensitive epoxy insulative resin or the like to cover the wirings 31 and 32 by a screen printing method. Or, a film-like photosensitive epoxy insulative resin or the like may be laminated onto the adhesive layer 20 so as to cover the wirings 31 and 32 to form the solder resist layer 62.

By exposing the coated or laminated insulative resin to light and developing the same, an opening portion 62x having a shape corresponding to the opening portion 81x is formed (photolithography). The opening portion 62x may be formed by laser processing or blasting. Because the solder resist layer 62 does not contribute to reflection, the color of the solder resist layer 62 can be other than white.

As described, by forming the solder resist layer 62 so as to cover the upper and side surfaces of the wirings 31 and 32 except for the portions positioning inside the opening portion 81x of the reflection plate 81, an area for forming the plating films 41 and 42 can be reduced. Therefore, the manufacturing cost can be reduced.

Further, within the fourth embodiment, the reflection plate 81 and the plating films 41 and 42 (the wirings 31 and 32) are insulated only by the adhesive layer 70. On the other hand, within the fourth embodiment, the reflection plate 81 and the wirings 31 and 32 are insulated by the solder resist layer 62 and the adhesive layer 70 to thereby securely insulate the reflection plate 81 from the wirings 31 and 32.

Modified Example 3 of Fourth Embodiment

Within the modified example 3 of the fourth embodiment, a reflection plate is provided in the light-emitting element mounting package in a mode of mounting the light-emitting element by wire bonding on the light-emitting element mounting package. Within the modified example 3 of the fourth embodiment, explanation of component parts the same as those described in the above description of the embodiments is omitted.

Figure 23:
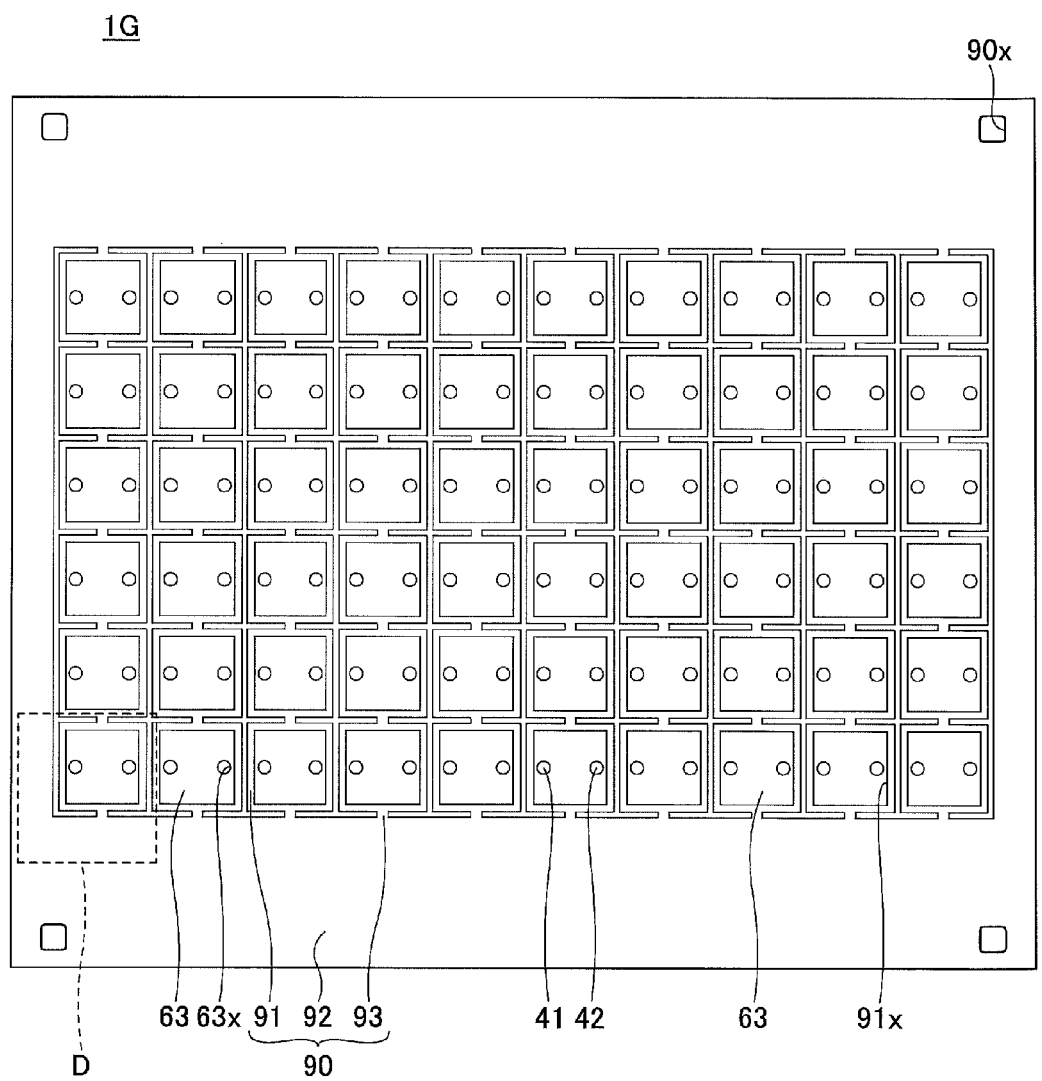
FIG. 23 is an exemplary plan view of a light-emitting element mounting package of a modified example 3 of the fourth embodiment.
Figure 24:
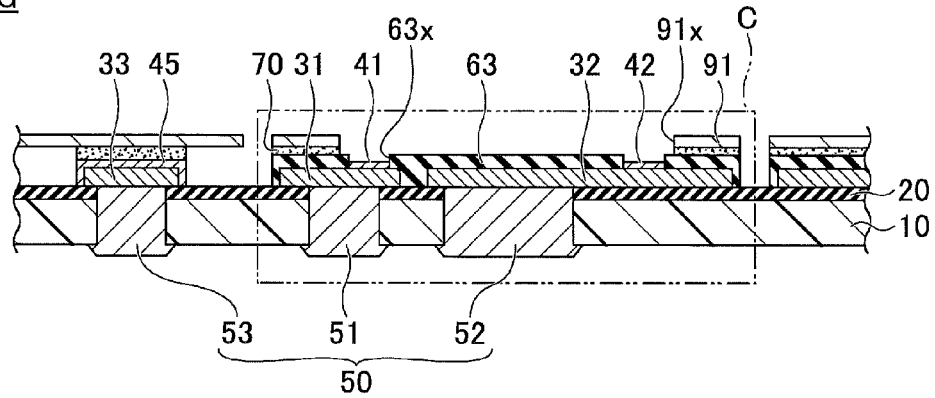
FIG. 24 is an exemplary enlarged view illustrating a part D of FIG. 23.
Figure 25:
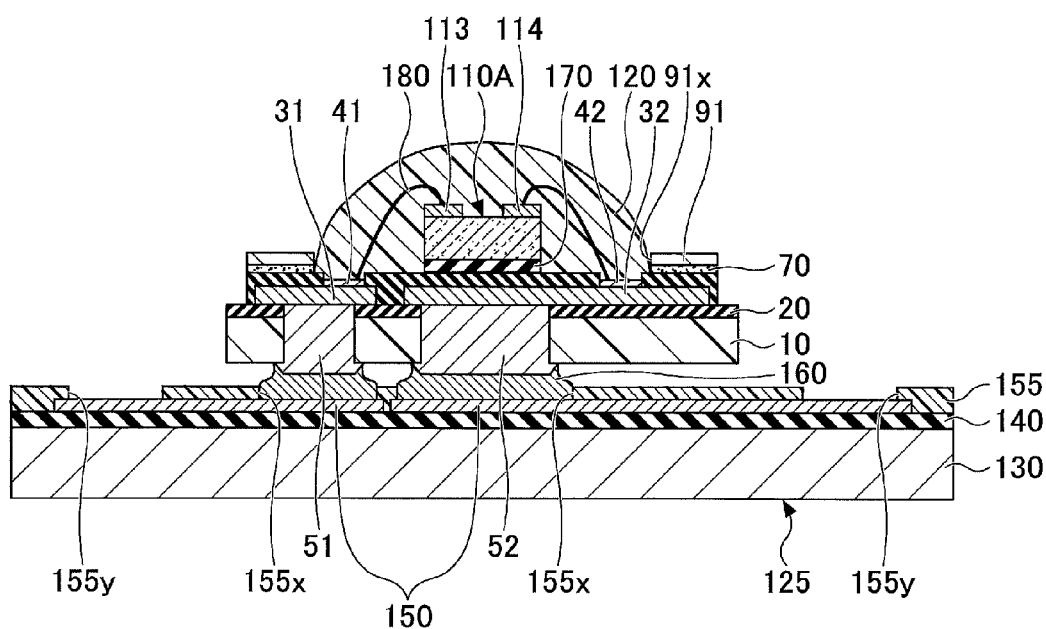
FIG. 25 is an exemplary cross-sectional view of the light-emitting element package of the modified example 3 of the fourth embodiment.

FIG. 23 is an exemplary plan view of a light-emitting element mounting package of the modified example 3 of the fourth embodiment. FIG. 24 is an exemplary enlarged cross-sectional view of a portion D (a portion surrounded by a broken line) of FIG. 23. FIG. 24 illustrates a cross-sectional view corresponding to FIG. 16B. FIG. 25 illustrates a cross-sectional view of a light emitting element package 100G of the modified example 3 of the fourth embodiment. FIG. 25 corresponds to FIG. 17.

A metallic member 90 may be provided in the light-emitting element mounting package 1G in the mode of mounting the light-emitting element on it and the light-emitting element package in a manner similar to the light-emitting element mounting package 1G illustrated in FIGS. 23 and 24 and the light-emitting element package 100G illustrated in FIG. 25. In the light-emitting element mounting package 1G, the substrate 10, the adhesive layer 20, the wirings 30, and the through wirings 50 have structures similar to those of the light-emitting element mounting package 1A (see FIG. 7).

However, the light-emitting element mounting package 1G includes the solder resist layer 63 instead of the insulating layer 60. The solder resist layer 63 includes an opening portion 63x for exposing parts of the wirings 31 and 32 on the solder resist layer 63. The plating films 41 and 42 are formed on the wirings 31 and 32, which are exposed inside the opening portion 63x. In the light-emitting element package 100G, the metallic wires 180 (bonding wires) are connected to the plating films 41 and 42.

The solder resist layer 63 is formed in a manner similar to the solder resist layer 62 described in the modified example 2 of the fourth embodiment. As described, by forming the solder resist layer 63 which is opened at a portion to which the metallic wire is connected, areas of the parts formed with the plating films 41 and 42 can be reduced. Therefore, the manufacturing cost of the light-emitting element mounting package 1G can be reduced.

In the light-emitting element mounting package 1G, plural individual package areas C to be individual light-emitting element mounting packages as a result of dicing are longitudinally and laterally arranged on the substrate 10. The metallic member 90 includes plural reflection plates 91 longitudinally and laterally arranged while interposing a predetermined interval, a frame portion 92 entirely surrounding the reflection plates 91, and hung portions 93 connecting the frame portion 92 with the reflection plates 91 adjacent to the frame portion 92, and the mutually adjacent reflection plates 91. The reflection plates 91 are arranged on each light-emitting element mounting portion inside each individual package area C. The reflection plates 91, the frame portion 92, and the hung portions 93 are integrally formed.

In the fourth embodiment, the hung portion 93 may be provided only in one direction (the longitudinal direction on FIG. 23). The hung portion may be provided only in the lateral direction or in the longitudinal and lateral directions on FIG. 23. Sprocket holes 90x functioning in a manner similar to the sprocket holes 10x are provided in the frame portion 92 of the metallic member 90.

An area where the light-emitting element 110A is mounted and an opening portion 91x for exposing the plating films 41 and 42, to which the metallic wire 180 (the bonding wire) is connected, are provided on each reflection plate 91 of the metallic member 90. For example, the shape of the opening portion 91x is rectangular. The metallic member 90 is formed to be thinner than the metallic member 80. The inner wall surface of the opening portion 91x of each reflection plate 91 is not a slanted surface. Within the fourth embodiment, light emitted by the light-emitting element 110A is reflected on the upper surface of the reflection plate 91 when the light-emitting element 110A mounted inside the opening portion 91x emits light. Because the inner wall surface of the opening portion 91x of the reflection plate 91 is not a slanted surface, the metallic member 90 can be thinner than the metallic member 80. For example, the thickness of the metallic member 90 is about 70 μm.

The light-emitting element 110A is mounted on a light-emitting element mounting portion (the wirings 31 and 32) of the light-emitting element mounting package 1G after dicing (a portion of the individual package area C). Then, the light-emitting element 110A is sealed by a sealing resin 120 and further mounted on the metallic substrate 125. The sealing resin 120 is provided inside the opening portion 91x of the reflection plate 91. The inner wall surface of the opening portion 91x of the reflection plate 91 functions as a dam for preventing the sealing resin 120 from flowing out.

As described, even if the reflection plate is provided in the light-emitting element mounting package in a mode of mounting the light-emitting element by wire bonding, effects similar to those of the fourth embodiment are obtainable. However, within the modified example 3 of the fourth embodiment, because the inner wall surface of the opening portion of each reflection plate is not a slanted surface, the light emitted by the light-emitting element is reflected on the upper surface of the reflection plate.

Modified Example 4 of Fourth Embodiment

Variations of the metallic member are described in the modified example 4 of the fourth embodiment. Within the modified example 4 of the fourth embodiment, explanation of component parts the same as those described in the above description of the embodiments is omitted.

Figure 26:
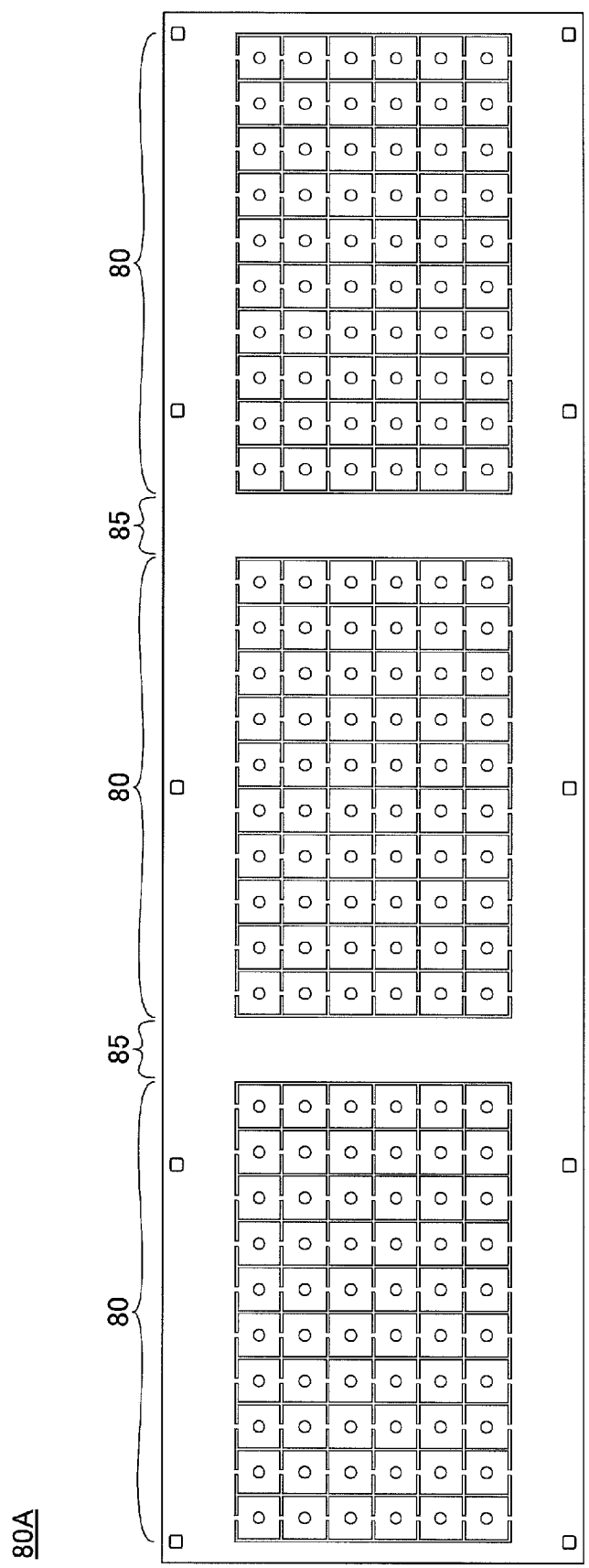
FIG. 26 illustrates an exemplary plan view of a metallic member of a modified example 4 of the fourth embodiment.

FIG. 26 illustrates an exemplary plan view of the metallic member of the modified example 4 of the fourth embodiment. As illustrated in FIG. 26, a metallic member 80A may be in a mode in which plural metallic members 80 are connected via connecting portions 85. The number of the metallic members 80 to be connected is not limited to three, and may be two or four or more.

A light-emitting element mounting package including many individual package areas C is realized by forming the substrate 10, the wirings 30 or the like so as to correspond to the metallic member 80A. As to the metallic member 90 (see FIG. 23), plural metallic members may be connected in a manner similar to the metallic member 80.

In the metallic member 80A, plural individual package areas C forming one metallic member 80 is a typical example of a first portion of the fourth embodiment. The plural individual package areas C forming another metallic member 80 arranged separate from the one metallic member is a typical example of a second portion of the fourth embodiment.

Figure 27A:
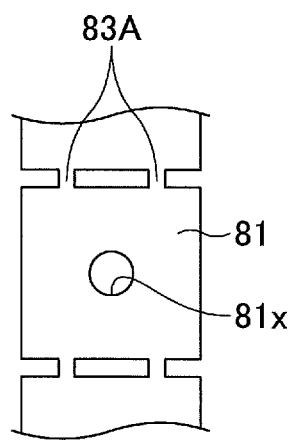
FIGS. 27A and 27B illustrate other exemplary shapes of hung portions.
Figure 27B:
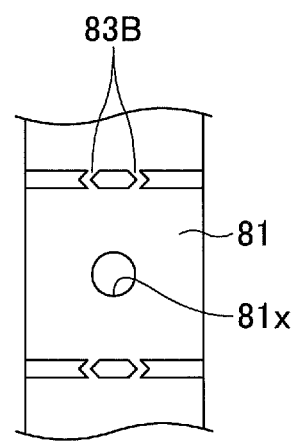

FIGS. 27A and 27B illustrate other exemplary shapes of hung portions. In the metallic members 80, the hung portions 83 may be substituted for by hung portions 83A illustrated in FIG. 27A. The hung portion 83A is in a mode in which the frame portion 82 and the reflecting plate 81 adjacent to the frame portion 82 and the mutually adjacent reflection plates 81 are arranged while interposing predetermined intervals. It is possible to adopt a mode in which the frame portion 82 is connected to the reflection plate 81 adjacent to the frame portion 82 by portions equal to 3 or more arranged with a predetermined gap and the mutually adjacent reflection plates 81 are connected by portions equal to 3 or more arranged with the predetermined gap.

In the metallic members 80, the hung portions 83 may be substituted for by hung portions 83B illustrated in FIG. 27B. The hung portion 83B is in a mode in which the frame portion 82 is connected to the reflection plate 81 adjacent to the frame portion 82 by portions equal to 2 arranged with a predetermined gap and the mutually adjacent reflection plates 81 are connected by portions equal to 2 arranged with the predetermined gap in a manner similar to the hung portion 83A. However, the two portions arranged while interposing the predetermined gap are bent unlike the hung portion 83A. Thus, the hung portion may be other than a linear shape.

In a case where the hung portions 83B are used, an opening portion is formed by the insides of the two portions while interposing the predetermined gap. However, the embodiment is not limited to this mode. For example, the two portions arranged with the predetermined gap may have two bent positions so as to form an octagonal opening portion. For example, the two portions arranged with the predetermined gap may curve so as to form an ellipsoidal opening portion. As to the metallic members 80A and 90, the hung portion 83A or 83B is applicable.

When a part of the upper surface of the hung portions 83, 83A, and 83B and a part of the lower surface of the hung portions 83, 83A, and 83B are removed so as to be thin, the individual package areas C are preferably cut out in dicing.

For example, instead of adhering the metallic layer 30A to the substrate 10 via the adhesion layer 20, the following method can be used. The substrate 10 being a polyimide resin film (a polyimide tape) or the like is prepared to directly form the metallic layer made of copper (Cu) on one surface of the substrate 10 (without providing the adhesive layer 20) using electroless plating, sputtering, electroplating, or the like. Then, the formed metallic layer is used instead of the metallic layer 30A to perform a function similar to that of the metallic layer 30A. In this case, the through holes 50x are formed only in the substrate 10 by a laser processing method or the like. Said differently, one side of each through hole 50x is filled (clogged) by the metallic layer formed on the substrate 10.

As another example, the substrate 10 may be formed by coating an insulating resin such as polyimide or the like on a metallic foil such as a copper foil. In this case also, the through holes 50x are formed only in the substrate 10 by a laser processing method or the like. Said differently, one side of each through hole 50x is filled (clogged) by the metallic foil formed on the substrate 10.

A plating film made of, for example, nickel (Ni) or gold (Au) may be formed on the protruding portion (the connection terminal) of the through wiring 51 or 52. The protruding portion (the connection terminal) of the through wiring 51 or 52 may be antioxidized by, for example, an Organic Solderability Preservative (OSP) process.

The embodiments and the modified examples of the embodiments may be appropriately combined. For example, in the light-emitting element mounting package 1G, the reflective film 61 (a white colored reflective film) is on the upper surface of the reflection plate 91. Alternatively, the reflective film 61 may be formed on the upper surface of the reflection plate 91 and the inner wall surface of the opening portion 91x. Further, in the light-emitting element mounting package 1G, instead of the metallic member 90, the metallic member 80 having the inner wall surface being the slated surface may be used.

According to the disclosure, there are provided a light-emitting element mounting package having a heat radiation route, which can efficiently transfer heat generated by the light-emitting element to a radiator portion provided outside, a manufacturing method of the same, and a light-emitting element package formed by mounting the light emitting element on the light-emitting element mounting package.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiment of the present invention has been described in detail, it should be understood that various changes, substitutions, and alterations could be made thereto without departing from the spirit and scope of the invention.

What is claimed is:

1. A light-emitting element mounting package comprising:
   a substrate;
   a first wiring that is provided on one surface of the substrate, is formed in a plane shape in its side view, has one protrusion which extends in a direction parallel to the one surface of the substrate in its plan view, and includes a first connecting portion at which the first wiring is connected to an electrode of a light-emitting element;
   a second wiring that is provided on the one surface of the substrate, is formed in a plane shape in the side view, has two protrusions which extend in an another direction parallel to the one surface and opposite to the direction and form a recess therebetween in the plan view, and includes a second connecting portion at which the second wiring is connected to another electrode of the light-emitting element, the first wiring and the second wiring being arranged to face each other so that the one protrusion of the first wiring intersects a straight line connecting two respective front edges of the two protrusions of the second wiring, the two front edges both facing the first wiring;
   a first through wiring, an end of which is connected to a back surface of the first wiring and another end of which is exposed from another surface of the substrate and which forms a connection terminal; and
   a second through wiring, an end of which is connected to a back surface of the second wiring and another end of which is exposed from the another surface of the substrate and which forms another connection terminal.

2. The light-emitting element mounting package according to claim 1,
   wherein the first wiring includes a linear portion and the one protrusion on a side where the first wiring and the second wiring face each other,
   wherein the second wiring includes a linear portion and the recess on a side where the first wiring and the second wiring face each other,
   wherein the light-emitting element is mounted on facing portions where the one protrusion of the first wiring and the recess of the second wiring mutually face,
   wherein a protecting part for electrically protecting the light-emitting element is mounted on facing portions where the linear portions of the first and second wirings mutually face.

3. The light-emitting element mounting package according to claim 1,
   wherein the substrate is made of an insulating resin film,
   wherein the first and second wirings are made of a metallic layer and provided on the one surface of the substrate through an adhesive layer.

4. The light-emitting element mounting package according to claim 1,
   wherein the substrate includes
      a first through hole through which a back surface of the first wiring is exposed, and
      a second through hole through which a back surface of the second wiring is exposed,
   wherein the first through wiring and the second through wiring are a plated metal filling the first through hole and the second through hole, respectively.

5. The light-emitting element mounting package according to claim 1, further comprising:
   an insulating layer provided on the first and second wirings to cover the first and second wirings and reflecting light irradiated by the light-emitting element,
   wherein the first connecting portion and the second connecting portion are exposed through an opening formed in the insulating layer.

6. The light-emitting element mounting package according to claim 1, further comprising:
   a reflection plate provided over the substrate,
   wherein the first connecting portion and the second connecting portion are exposed through an opening portion formed in the reflection plate.

7. A light-emitting element package comprising:
   a light-emitting element;
   a substrate;
   a first wiring that is provided on one surface of the substrate, is formed in a plane shape in its side view, has one protrusion which extends in a direction parallel to the one surface of the substrate in its plan view, and includes a first connecting portion at which the first wiring is connected to an electrode of the light-emitting element;
   a second wiring that is provided on the one surface of the substrate, is formed in a plane shape in the side view, has two protrusions which extend in an another direction parallel to the one surface and opposite to the direction and form a recess therebetween in the plan view, and includes a second connecting portion at which the second wiring is connected to another electrode of the light-emitting element, the first wiring and the second wiring being arranged to face each other so that the one protrusion of the first wiring intersects a straight line connecting two respective front edges of the two protrusions of the second wiring, the two front edges both facing the first wiring;

a first through wiring, an end of which is connected to a back surface of the first wiring and another end of which is exposed from another surface of the substrate and which forms a connection terminal; and a second through wiring, an end of which is connected to a back surface of the second wiring and another end of which is exposed from the another surface of the substrate and which forms another connection terminal.

8. The light-emitting element package according to claim 7, wherein the first wiring includes a linear portion and the one protrusion on a side where the first wiring and the second wiring face each other, wherein the second wiring includes a linear portion and the recess on a side where the first wiring and the second wiring face each other, wherein the light-emitting element is mounted on facing portions where the one protrusion of the first wiring and the recess of the second wiring mutually face, wherein a protecting part for electrically protecting the light-emitting element is mounted on facing portions where the linear portions of the first and second wirings mutually face.

\* \* \* \* \*